(12) United States Patent  
Mushika

(10) Patent No.: US 7,859,167 B2
(45) Date of Patent: Dec. 28, 2010

(54) MICRO ACTUATOR HAVING TILT AND VERTICAL DISPLACEMENT AND DEVICE HAVING SUCH MICRO ACTUATOR

(75) Inventor: Yoshihiro Mushika, Osaka (JP)

(73) Assignee: Panasonic Corporation, Osaka (JP)

( * ) Notice: Subject to any disclaimer, the term of this patent is extended or adjusted under 35 U.S.C. 154(b) by 559 days.

(21) Appl. No.: 10/597,784

(22) PCT Filed: Mar. 2, 2005

(86) PCT No.: PCT/JP2005/003533

§ 371 (c)(1),
(2), (4) Date: Aug. 8, 2006

(87) PCT Pub. No.: WO2005/085125

PCT Pub. Date: Sep. 15, 2005

(65) Prior Publication Data

US 2007/0159025 A1    Jul. 12, 2007

(30) Foreign Application Priority Data

Mar. 8, 2004    (JP)    .............................. 2004-063518

(51) Int. Cl.
*H02N 1/00*    (2006.01)
*G02B 26/08*    (2006.01)
(52) U.S. Cl. ..................... 310/309; 359/224.1; 359/290
(58) Field of Classification Search ................. 310/309; 359/223–226, 290, 291; 318/116; 248/603, 248/604, 618
See application file for complete search history.

(56) References Cited

U.S. PATENT DOCUMENTS

| | | | | |
|---|---|---|---|---|
| 6,512,625 | B2 * | 1/2003 | Sim et al. | .................... 359/290 |
| 6,690,850 | B1 * | 2/2004 | Greywall | ...................... 385/18 |
| 6,906,848 | B2 * | 6/2005 | Aubuchon | ................... 359/291 |
| 6,952,304 | B2 * | 10/2005 | Mushika et al. | ............. 359/295 |
| 6,963,679 | B1 * | 11/2005 | Novotny et al. | ................ 385/18 |

(Continued)

FOREIGN PATENT DOCUMENTS

JP    2003-005102    1/2003

(Continued)

OTHER PUBLICATIONS

International Search Report for corresponding Application No. PCT/JP2005/003533 mailed Apr. 19, 2005.

(Continued)

*Primary Examiner*—Karl I Tamai
(74) *Attorney, Agent, or Firm*—Renner, Otto, Boisselle & Sklar, LLP

(57) ABSTRACT

A microactuator according to the present invention comprises a base 1, a movable section 7 which is capable of displacement relative to the base 1, an elastic supporting member 5 for supporting the movable section 7, and driving sections 4a to 4c for causing the movable section 7 to be displaced. A specific relationship is imposed on a spring modulus responsive to a displacement of the movable section 7 along a vertical direction and a spring modulus responsive to a tilt angle of the movable section 7, and the diagonality between the driving force and the displacement of the movable section 7 is increased, thus realizing accuracy improvements and simplification of control of the microactuator.

29 Claims, 13 Drawing Sheets

U.S. PATENT DOCUMENTS

2002/0041455 A1   4/2002   Sawada et al.
2002/0149834 A1*  10/2002  Mei et al. .................. 359/295
2003/0223103 A1*  12/2003  Yoon et al. ................. 359/291
2004/0021924 A1   2/2004   Yasuda
2004/0160659 A1*  8/2004   DiCarlo ..................... 359/291
2007/0159025 A1*  7/2007   Mushika ..................... 310/309

FOREIGN PATENT DOCUMENTS

| | | |
|---|---|---|
| JP | 2003-035874 | 2/2003 |
| JP | 2003-057575 | 2/2003 |
| JP | 2003-075738 | 3/2003 |
| WO | WO 02/61488 * | 1/2002 |

OTHER PUBLICATIONS

Uthara Srinvasan et al.; "Fluidic Self-Assembly of Micromirrors Onto Microactuators Using Capillary Forces", IEEE Journal on Selected Topics in Quantam Electronics, vol. 8, No. 1, pp. 4-11, Jan./Feb. 2002. (Cited in [0003] on p. 2 of the description).

* cited by examiner

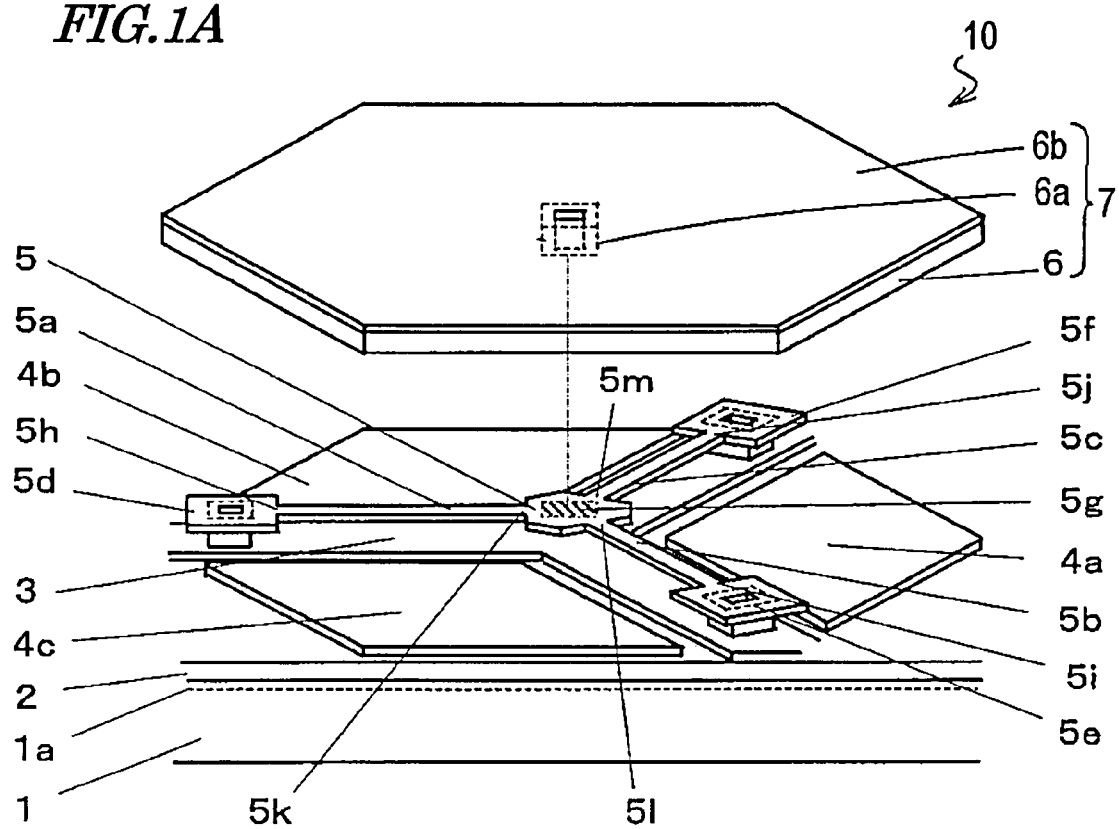

CONVENTIONAL ART

MICRO ACTUATOR HAVING TILT AND VERTICAL DISPLACEMENT AND DEVICE HAVING SUCH MICRO ACTUATOR

TECHNICAL FIELD

The present invention relates to a microactuator capable of tilt and vertical displacement, as well as an apparatus incorporating such microactuators.

BACKGROUND ART

Various microactuators have been produced by using MEMS (Micro Electro Mechanical System) techniques, and applications of microactuators to various fields such as optics, high-frequency circuits, and biotechnology are expected. For example, in the field of adaptive optics, micromirror arrays for controlling the wave front of light are being developed. In such applications, in order to smoothly control the wave front of light, it is effective to cause each light reflecting surface to have a tilt as well as a vertical displacement relative to a base.

An example of a microactuator which is capable of such tilt and vertical displacement is disclosed in Non-patent Document 1. FIG. 10 is a perspective view schematically showing a microactuator 1000 disclosed in Non-patent Document 1.

The movable electrode 100 is supported at its outer periphery by three elastic beams 101a, 101b, and 101c. Moreover, the movable electrode 100 opposes three stationary electrodes 102a, 102b, and 102c. The stationary electrodes 102a, 102b, and 102c are provided in such a manner that a driving voltage can independently be applied to each of them, whereby a potential difference with the movable electrode 100 is obtained. As a result, an electrostatic force is generated in a direction of pulling the movable electrode 100.

If equal driving voltages are set for the stationary electrodes 102a to 102c, the movable electrode 100 makes a vertical displacement in the lower direction, without tilting. If these driving voltages are made different, the movable electrode 100 makes a vertical displacement in the lower direction while tilting in the desired direction. Thus, the movable electrode 100 is capable of making a vertical displacement in the lower direction as well as having a bi-axial tilt.

Since the mirror 103 is attached to the movable electrode 100 at an attachment section 104, the displacement of the movable electrode 100 in itself governs the displacement of the mirror 103.

Non-patent Document 1: U. Srinivasan, et al., "Fluidic Self-Assembly of Micromirrors Onto Microactuators Using Capillary Forces", IEEE Journal on Selected Topics in Quantum Electronics, Vol. 8, No. 1, pp. 4-11 (January, 2002)

DISCLOSURE OF INVENTION

Problems to be Solved by the Invention

However, the aforementioned microactuator 1000 has a problem in that there is a large non-diagonality in the relationship between driving signals for the stationary electrodes and the mirror displacement. As used herein, non-diagonality means, when a predetermined voltage is applied to a given stationary electrode so that one end of the movable electrode 100 opposing that stationary electrode makes a displacement along the vertical direction, an end portion of the movable electrode 100 opposing another stationary electrode making a displacement along the vertical direction.

This problem will be described with reference to FIG. 11. FIG. 11 is a diagram showing an operation of the microactuator 1000. Since FIG. 11 is a schematic cross-sectional view of the microactuator 1000, only the movable electrode 100, two elastic beams 101a and 101b, and two stationary electrodes 102a and 102b are illustrated therein. A point of application a of a driving force that is exerted by the stationary electrode 102a on the movable electrode 100 is a point on an axis which extends through the center of a region of the stationary electrode 102a where the driving force occurs and which is perpendicular to the stationary electrode 102a. A point of application b of a driving force that is exerted by the stationary electrode 102b on the movable electrode 100 is a point on an axis which extends through the center of a region of the stationary electrode 102b where the driving force occurs and which is perpendicular to the stationary electrode 102b.

Herein, a case will be described where a predetermined voltage is applied only to the stationary electrode 102a to pull the movable electrode 100. The stationary electrode 102a generates a driving force F, and at the point of application a, the movable electrode 100 is displaced by δ along the vertical direction. At this time, the movable electrode 100 is also displaced along the vertical direction by δ' at the point of application b opposing the stationary electrode 102b, which is not generating driving force. The value δ'/δ of the ratio between the displacement δ' and the displacement δ will be used as an index of degree of non-diagonality.

From the standpoint of controlling the posture of the movable electrode 100, such non-diagonality should be as small as possible. If the non-diagonality is sufficiently small relative to the target resolution of displacement, the displacements of the movable electrode 100 at the points of application a and b can be independently controlled with the applied voltages on the corresponding stationary electrodes, and therefore the structure of the control device can be simplified. Moreover, even in the case of performing control for correcting displacements (e.g., δ') associated with non-diagonality, the accuracy improvements and simplification of control will become easier as the non-diagonality becomes smaller. Especially in the case of electrostatic driving, driving force can only occur in a pulling direction, and therefore it would be difficult to perform correction control in a direction of rendering the size of δ' back to zero. Moreover, in the case where the microactuator has large fluctuations in characteristics, the amount of data for correcting displacements associated with non-diagonality will become enormous. In particular, in the case where the aforementioned non-diagonality is large in an apparatus having a large number of microactuators (e.g., a micromirror array), the amount of data for correcting the displacements associated with non-diagonality will be enormous. This will cause a tremendous increase in cost and a decrease in the driving speed of the microactuators. From such a perspective, it is desirable that the non-diagonality is as small as possible.

However, as is clear from FIG. 10 and FIG. 11, in any structure in which the movable electrode 100 is supported at its outer periphery, with stationary electrodes being formed inside, the driving force F generated by one stationary electrode 102a will cause all positions on the movable electrode 100 to be displaced in the lower direction, and therefore there is a very large non-diagonality. In terms of accuracy improvements and simplification of correction control, it would be desirable that the non-diagonality δ'/δ is ⅓ or less. However, in accordance with the structure of the conventional microactuator 1000, it has been very difficult to reduce the non-diagonality to ⅓ or less, even with design optimization.

The present invention has been made in view of the aforementioned problems, and an objective thereof is to provide a microactuator whose non-diagonality between driving force and displacement of a movable section is reduced, and an apparatus incorporating such microactuators.

Means for Solving the Problems

A microactuator according to the present invention is characterized in that the microactuator comprises: a base; a movable section capable of displacement relative to the base; an elastic supporting member for supporting the movable section so as to allow the movable section to make a displacement relative to the base along a vertical direction and a tilt relative to the base; and a plurality of driving sections for causing the movable section to be displaced relative to the base, wherein, the plurality of driving sections include a first driving section and a second driving section, and the elastic supporting member supports the movable section at a position intermediate between a first point of application of a first driving force which is exerted by the first driving section on the movable section and a second point of application of a second driving force which is exerted by the second driving section on the movable section, and assuming that: a spring modulus of a restoring force occurring in the elastic supporting member responsive to a displacement of the movable section relative to the base along the vertical direction is kz(N/m); a spring modulus of a restoration torque occurring in the elastic supporting member responsive to a tilt angle of the movable section relative to the base is kr(Nm/rad); and a distance between the first point of application and the second point of application is 2L(m), kz, kr, and L satisfy the relationship of: $0.5 \leq L^2 \cdot kz/kr \leq 2$.

A microactuator according to the present invention is characterized in that the microactuator comprises: a base; a movable section capable of displacement relative to the base; an elastic supporting member for supporting the movable section so as to allow the movable section to make a displacement relative to the base along a vertical direction and a bi-axial tilt relative to the base; and a plurality of driving sections for causing the movable section to be displaced relative to the base, wherein, the elastic supporting member supports the movable section at a position surrounded by a plurality of points of application at which driving forces exerted by the plurality of driving sections on the movable section are applied, and assuming that: a spring modulus of a restoring force occurring in the elastic supporting member responsive to a displacement of the movable section relative to the base along the vertical direction is kz(N/m); spring moduli of restoration torques occurring in the elastic supporting member responsive to a tilt angle of the bi-axial tilt of the movable section are krx(Nm/rad) and kry(Nm/rad); and a distance between each of the plurality of points of application and the position at which the elastic supporting member supports the movable section is R(m), kz, krx, kry, and R satisfy the relationships of: $1 \leq R^2 \cdot kz/krx \leq 5$; $1 \leq R^2 \cdot kz/kry \leq 5$; and $0.67 \leq krx/kry \leq 1.5$.

In one embodiment, the elastic supporting member supports a generally central portion of the movable section.

In one embodiment, at least a portion of the movable section is electrically conductive; each of the plurality of driving sections includes an electrode opposing the movable section; and each of the plurality of driving sections drives the movable section with an electrostatic force occurring between the movable section and the electrode.

In one embodiment, the plurality of driving sections are disposed so as to be generally symmetric around an axis which extends through the position at which the elastic supporting member supports the movable section and which is perpendicular to the base.

In one embodiment, the elastic supporting member comprises a first end portion connected to the base and a second end portion connected to the movable section, and assuming that a distance between the first end portion and the second end portion is H, H and R satisfy the relationship of: $0.8 \leq H/R \leq 1.6$.

In one embodiment, a distance between the first end portion and a central portion of the movable section is longer than a distance between the second end portion and the central portion of the movable section.

In one embodiment, the elastic supporting member comprises a beam, and the beam includes a turn-back portion at which a direction in which the beam extends is reversed.

In one embodiment, the distance between the turn-back portion and the central portion of the movable section is longer than the distance between a position at which the elastic supporting member is connected to the base and a central portion of the movable section.

In one embodiment, when one of the plurality of driving sections drives the movable section so that one end of the movable section is displaced in a direction of approaching the base, another end of the movable section is displaced in a direction of becoming more distant from the base.

In one embodiment, kz, kr, and L satisfy the relationship of: $1 \leq L^2 \cdot kz/kr$.

In one embodiment, kz, krx, kry, and R satisfy the relationships of: $2 \leq R^2 \cdot kz/krx$; and $2 \leq R^2 \cdot kz/kry$.

An apparatus according to the present invention is characterized in that the apparatus comprises a plurality of aforementioned microactuators, wherein the plurality of microactuators share the base with one another.

An apparatus according to the present invention is characterized in that the apparatus comprises a plurality of aforementioned microactuators, wherein, the plurality of microactuators share the base with one another, and assuming that a pitch between adjoining microactuators among the plurality of microactuators is P(m), P and R satisfy the relationship of: $0.29 \leq R/P \leq 0.37$.

In one embodiment, the apparatus further comprises a control section for outputting a control signal to the plurality of driving sections to control the displacement of the movable section.

In one embodiment, the control section is capable of causing the movable section to be displaced in three or more steps.

In one embodiment, the control section outputs the control signal being in accordance with a target displacement amount for a point of application of a driving force exerted on the movable section by the driving section among the plurality of driving sections that receives the control signal.

In one embodiment, the movable section further comprises a light reflecting surface.

In one embodiment, the apparatus further comprises a light source for generating light.

In one embodiment, the apparatus further comprises a wave front information generation section for receiving light which has passed at the light reflecting surface and generating wave front information representing a wave front state of the light, wherein the control section causes the movable section to be displaced in accordance with the wave front information.

EFFECTS OF THE INVENTION

According to the present invention, an elastic supporting member supports a movable section at a position intermediate between a plurality of points of application or surrounded by a plurality of points of application. Moreover, a specific relationship is imposed on a spring modulus responsive to a displacement of the movable section along a vertical direction and a spring modulus responsive to a tilt angle of the movable section. As a result, the non-diagonality can be decreased (i.e., diagonality can be increased) between the driving force of the driving section and the displacement of the movable section, thus easily realizing accuracy improvements and simplification of control of the microactuator. Moreover, a control device for controlling the microactuator can have a simple structure.

According to the present invention, the non-diagonality between the driving force of the driving section and the displacement of the movable section is small, and the displacements at the respective positions of points of application in the movable section can be independently controlled without mutual interference, whereby simplification of control and high accuracy can be realized.

BRIEF DESCRIPTION OF DRAWINGS

FIG. 1A An exploded perspective view schematically showing a microactuator according to Embodiment 1 of the present invention.

Figure 1B:
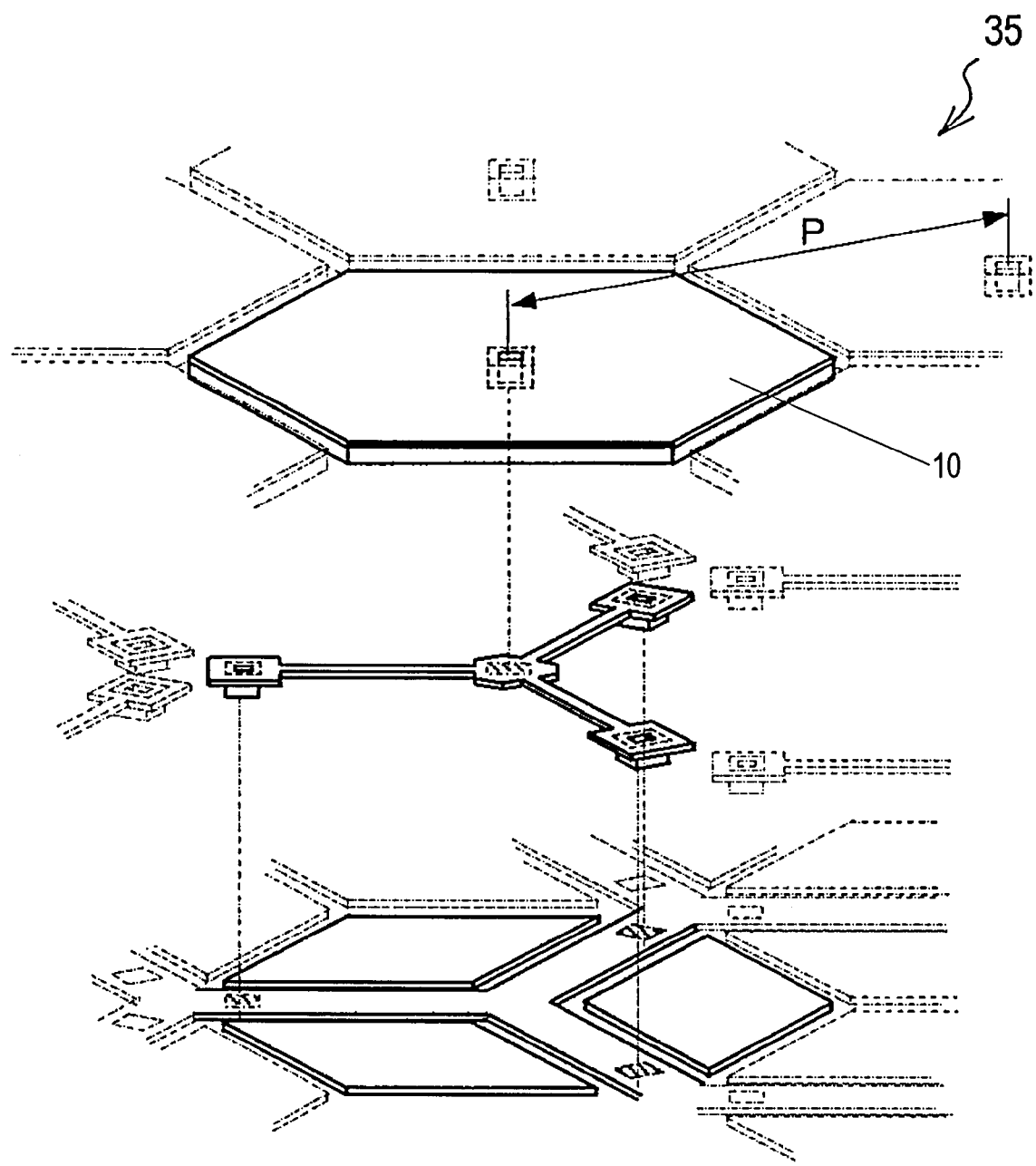
FIG. 1B An exploded perspective view schematically showing an microactuator array according to Embodiment 1 of the present invention.

DESCRIPTION OF THE REFERENCE NUMERALS 1 substrate
4a-4c, 14a-14c, 24a-24c stationary electrodes
5, 15, 25 elastic supporting member
5a, 15a, 25a elastic beam
5h-5j, 15h-15j, 25h-25j stationary ends
5k-5m, 15k-15m, 25k-25m movable ends
15n-15s, 25n-25p turn-back portions
6 movable electrode
6b mirror section
7 movable section
10, 10a, 10b microactuator
31 light source
35 microactuator array
42 control section
47 wave front information generation section

BEST MODE FOR CARRYING OUT THE INVENTION

Hereinafter, with reference to the figures, embodiments of microactuators according to the present invention and an apparatus incorporating such microactuators will be described.

Embodiment 1

With reference to FIG. 1A to FIG. 4, a first embodiment of the microactuator according to the present invention will be described.

First, FIG. 1A will be referred to. FIG. 1A is an exploded perspective view schematically showing a microactuator 10 of the present embodiment.

The microactuator 10 comprises a base 1, a movable section 7, an elastic supporting member 5, and stationary electrodes 4a, 4b, and 4c. The microactuator 10 is produced by using an MEMS technique, for example. The base 1 is a silicon substrate, for example. On the base 1, a driving circuit 1a is provided, with an insulating layer 2 being provided on the driving circuit 1a. On the insulating layer 2, the stationary electrodes 4a to 4c and a ground wiring portion 3 are provided. The movable section 7 is capable of making displacements relative to the base 1. The elastic supporting member 5 is elastic, and supports the movable section 7 so as to enable a displacement of the movable section 7 in a direction perpendicular to the plane direction of the base 1, as well as a tilt of the movable section 7 relative to the base 1. Each of the stationary electrodes 4a to 4c functions as a driving section for driving the movable section 7 in a direction perpendicular to the plane direction of the base 1. As the materials of the stationary electrodes 4a to 4c and the ground wiring portion 3, electrically conductive materials which permit low temperature film formation at 450° C. or less, e.g., an aluminum (Al) alloy or polysilicon germanium (Poly-SiGe), are used. Each of the stationary electrodes 4a to 4c is connected to the driving circuit 1a through a via (not shown) which is formed in the insulating layer 2. The driving circuit 1a is able to independently apply a driving voltage in a predetermined voltage range (e.g., 0 to 30V) to each of the stationary electrodes 4a to 4c. The driving voltage may be prescribed in multiple steps of values of e.g. 10 bits.

The elastic supporting member 5 includes three elastic beams 5a to 5c, fixture portions 5d to 5f for affixing the elastic beams 5a to 5c to the base 1, and a support portion 5g for supporting the movable section 7. The elastic beams 5a to 5c are connected to the ground wiring portion 3. Among the end portions of the elastic beams 5a to 5c, those end portions which are connected to the fixture portions 5d to 5f will be referred to as stationary ends 5h to 5j, whereas those end portions which are connected to the support portion 5g will be referred to as movable ends 5k to 5m.

In order to form the elastic supporting member 5, a first sacrificial layer (not shown) may be first formed on the ground wiring portion 3 and the stationary electrodes 4a to 4c by using a photoresist, and then the elastic supporting member 5 may be formed on this first sacrificial layer. As the material of the elastic supporting member 5, an electrically conductive material similar to those of the ground wiring portion 3 and the stationary electrodes 4a to 4c is used.

The support portion 5g is connected to a protrusion 6a which is provided in a central portion of the movable electrode 6. The three elastic beams 5a to 5c are linked to one another via the support portion 5g.

In order to form the movable section 7, a second sacrificial layer (not shown) may be first formed on the elastic supporting member 5 by using a photoresist, and then the movable electrode 6 may be formed on the second sacrificial layer. The movable electrode 6 has a generally regular hexagonal shape. As the material of the movable electrode 6, an electrically conductive material similar to those of the ground wiring portion 3 and the stationary electrodes 4a to 4c is used. The upper face of the movable electrode 6 constitutes a mirror section 6b, which is a light reflecting surface. In order to further enhance the light reflection efficiency, gold or a dielectric multilayer film, etc., may be coated on the upper face of the movable electrode 6 to form the mirror section 6b. In the production step of the microactuator 10, the aforementioned first and second sacrificial layers are to be eventually removed with an organic solvent, oxygen plasma or the like, with a gap being left in any removed site. The movable electrode 6 is connected to the driving circuit 1a via the elastic supporting member 5 and the ground wiring portion 3, and is maintained at the ground potential.

The movable electrode 6 opposes the three stationary electrodes 4a to 4c via a gap. When a potential difference(s) emerges between the movable electrode 6 and the stationary electrodes 4a to 4c, an electrostatic force(s) occurs between the movable electrode 6 and the stationary electrodes 4a to 4c. These electrostatic forces are utilized as driving forces for driving the movable section 7. When the movable section 7 is displaced with these driving forces, the elastic supporting member 5 deforms elastically, and the posture of the movable section 7 is determined based on the balance between the elastic restoring force of the elastic supporting member 5 and the driving forces. By controlling the size of the driving force generated by each stationary electrodes 4a to 4c, it becomes possible to control the amount of displacement of the movable section 7 in a direction perpendicular to the base 1 and the amount of its tilt relative to the base 1. If equal driving voltages are set for the stationary electrodes 4a to 4c, the movable section 7 will make a vertical displacement in a direction such that the entire movable section 7 (including the central portion of the movable section 7) approaches the base 1, while making hardly any tilt. By making these driving voltages different from one another, the movable section 7 will tilt in a desired direction. Herein, the tilt relative to the base 1 is a tilt around two tilt axes which are parallel to the plane direction of the base 1 and are perpendicular to each other.

FIG. 1B shows a microactuator array 35 in which a plurality of unit cells are arranged, where each unit cell is a microactuator 10 as described above. FIG. 1B is an exploded perspective view schematically showing the microactuator array 35. The movable section 7, the elastic supporting member 5, and the stationary electrodes 4a to 4c comprised in the plurality of microactuators 10 are provided on a single base 1, such that the plurality of microactuators 10 share the single base 1.

A pitch P between adjoining microactuators 10 is 110 μm, for example. The number of microactuators 10 is 42×36, for example. The microactuator array 35 comprising such a plurality of microactuators 10 functions as a micromirror array.

Next, with reference to FIG. 2A to FIG. 3C, the conditions for reducing the non-diagonality between the driving forces generated by the stationary electrodes 4a to 4c and the displacements of the movable section 7 will be described. The microactuator 10 (FIG. 1A) is supported by the elastic supporting member 5 so as to be capable of bi-axial tilt and mono-axial vertical displacement. Descriptions will be given in the following order: first, a one-dimensional model where mono-axial tilt and mono-axial vertical displacement take place will be described, followed by a description of a two-dimensional model where bi-axial tilt and mono-axial vertical displacement take place.

Figure 2A:
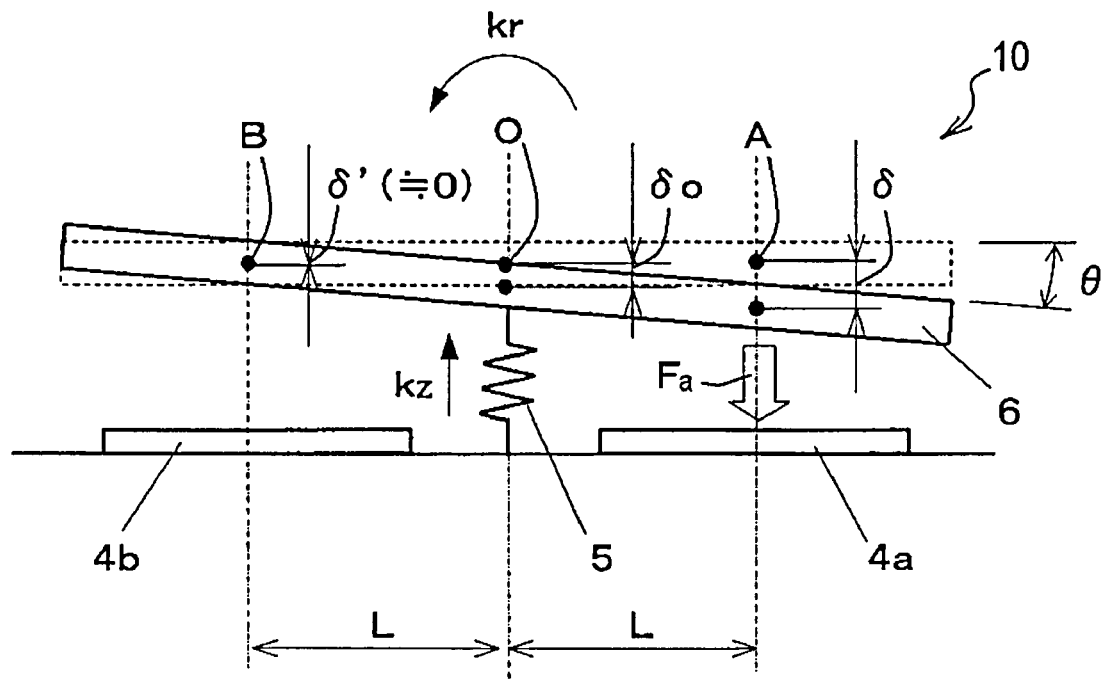
FIG. 2A An explanatory diagram of an operation of the microactuator according to Embodiment 1 of the present invention.
Figure 2B:
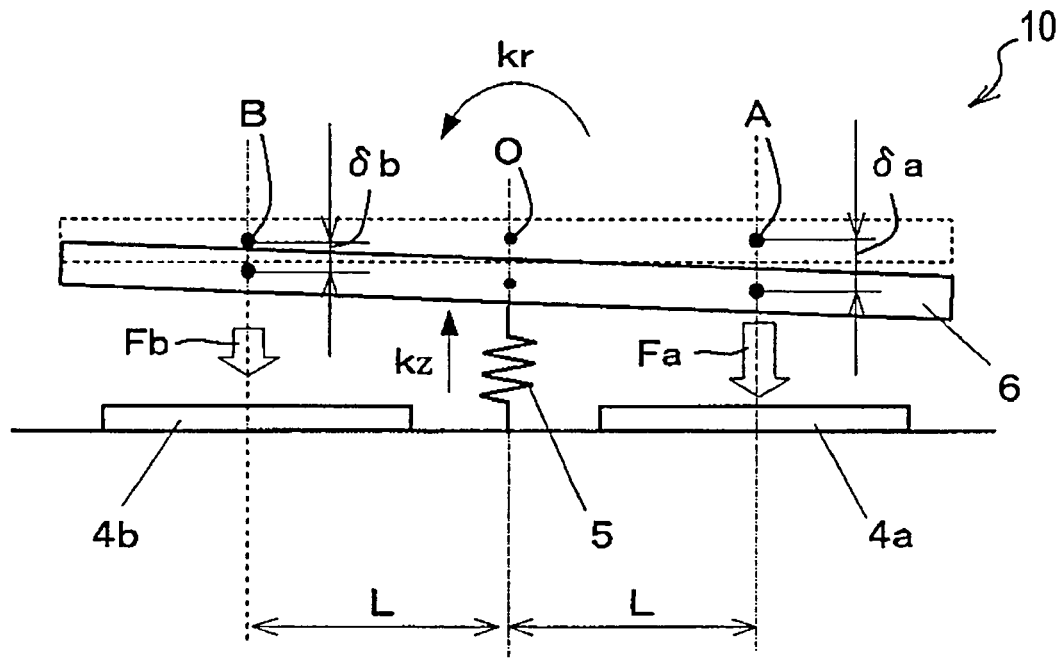
FIG. 2B An explanatory diagram of an operation of the microactuator according to Embodiment 1 of the present invention.

FIG. 2A and FIG. 2B are explanatory diagrams of operations of the microactuator 10 in a one-dimensional model. FIG. 2A shows a state in which a predetermined voltage is applied only to the stationary electrode 4a to pull the movable electrode 6.

A point of application A of a driving force that is exerted by the stationary electrode 4a on the movable electrode 6 of the movable section 7 is a point on an axis which extends through the center of a region of the stationary electrode 4a where the driving force occurs and which is perpendicular to the stationary electrode 4a. A point of application B of a driving force that is exerted by the stationary electrode 4b on the movable electrode 6 of the movable section 7 is a point on an axis which extends through the center of a region of the stationary electrode 4b where the driving force occurs and which is perpendicular to the stationary electrode 4b. Since the elastic supporting member 5 supports a generally central portion of the movable electrode 6, under a one-dimensional model, the elastic supporting member 5 is supporting the movable electrode 6 at a position between the point of application A and the point of application B (central portion O).

Around an axis which extends through this central portion O and which is perpendicular to the base 1 (FIG. 1A), the stationary electrodes 4a and 4b are disposed generally symmetrically. Thus, the distance between the central portion O and the point of application A and the distance between the central portion O and the point of application B are both generally L (m). The distance between the point of application A and the point of application B is 2L.

It is assumed that a spring modulus for the restoring force which occurs in the elastic supporting member responsive to a vertical displacement δo(m) at the central portion O of the movable electrode 6 relative to the base 1 is kz(N/m), and that a spring modulus for the restoration torque which occurs in the elastic supporting member 5 responsive to a tilt angle θ(rad) of the movable electrode 6 relative to the base 1 is kr(Nm/rad). It is assumed that the driving force which occurs at the point of application A when a predetermined voltage is applied only to the stationary electrode 4a to pull the movable electrode 6 is Fa(N), and that the driving force which occurs at the point of application B when a predetermined voltage is applied only to the stationary electrode 4b to pull the movable electrode 6 is Fb(N). It is also assumed that the displacement along the vertical direction of the movable electrode 6 at the point of application A is δ(m), and that the displacement along the vertical direction of the movable electrode 6 at the point of application B is δ'(m). In this case, equilibrium of forces is expressed by (eq. 1).

$$Fa+Fb=(\delta+\delta')/2 \times kz \quad (eq.\ 1)$$

Moreover, equilibrium of moments is expressed by (eq. 2).

$$L \cdot (Fa-Fb)=(\delta-\delta')/2L \times kr \quad (eq.\ 2)$$

Referring to FIG. 2A, in the case where a predetermined voltage is applied only to the stationary electrode 4a to pull the movable electrode 6, a driving force Fa is generated at the point of application A, and the movable electrode 6 is displaced by δ along the vertical direction at the point of application A. In the meantime, at the point of application B where no driving force is generated, the movable electrode 6 is displaced by δ' along the vertical direction. In this case, since Fb=0, it follows from (eq. 1) and (eq. 2) that:

$$Fa=(\delta+\delta')/2 \times kz; \text{ and} \quad (eq.\ 3)$$

$$L \cdot Fa=(\delta-\delta')/2L \times kr. \quad (eq.\ 4)$$

From (eq. 3) and (eq. 4), it follows that:

$$\delta=(1/kz+L^2/kr)Fa; \text{ and} \quad (eq.\ 5)$$

$$\delta'=(1/kz-L^2/kr)Fa. \quad (eq.\ 6)$$

Therefore, the degree of non-diagonality δ'/δ is given by (eq. 7).

$$\frac{\delta'}{\delta} = \frac{1-(L^2 \cdot kz/kr)}{1+(L^2 \cdot kz/kr)} \quad (eq.\ 7)$$

From (eq. 7), it is known that by approximating the value of $L^2 \cdot kz/kr$ to one, the degree of non-diagonality δ'/δ can be reduced to a desired value. There exists a direct correspondence between the degree of non-diagonality δ'/δ and the value of $L^2 \cdot kz/kr$, and this relationship is expressed in (Table 1).

TABLE 1

| Degree of non-diagonality δ'/δ | Necessary condition for $L^2 \cdot kz/kr$ |
|---|---|
| 0.5 | $0.33 \leq L^2 \cdot kz/kr \leq 3$ |
| 0.33 ... (=⅓) | $0.5 \leq L^2 \cdot kz/kr \leq 2$ |
| 0.25 | $0.6 \leq L^2 \cdot kz/kr \leq 1.67$ |
| 0.2 | $0.67 \leq L^2 \cdot kz/kr \leq 1.5$ |
| 0.1 | $0.82 \leq L^2 \cdot kz/kr \leq 1.2$ |

Figure 10:
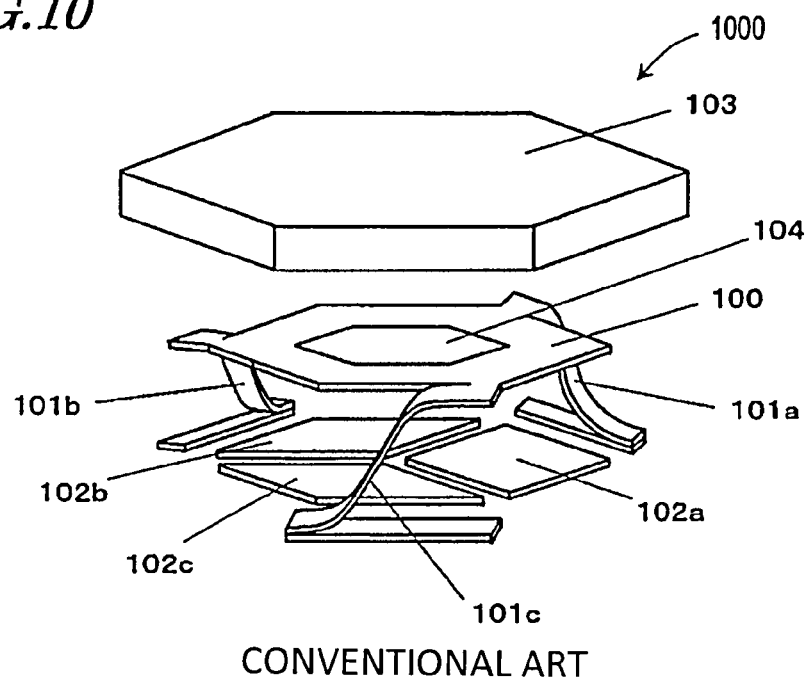
FIG. 10 A perspective view schematically showing a conventional microactuator.
Figure 11:
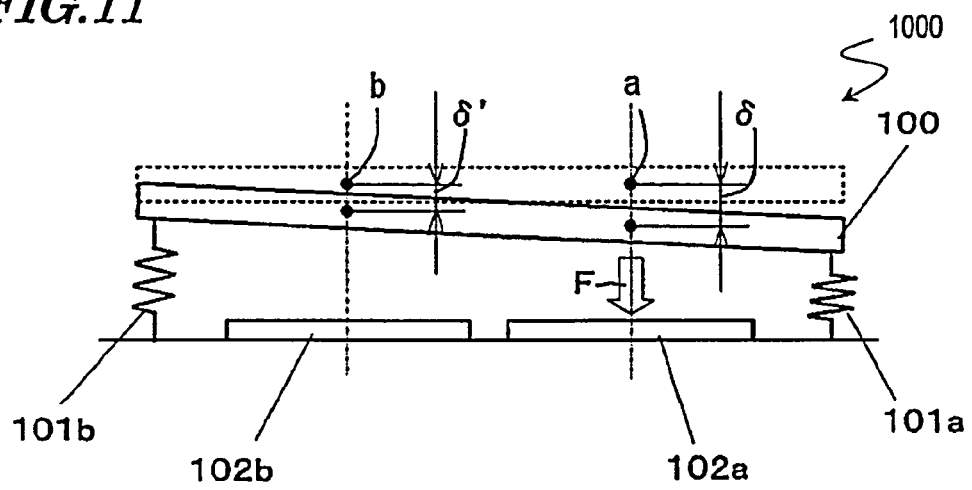
FIG. 11 An explanatory diagram of an operation of a conventional microactuator.

It has already been described that it is very difficult to reduce the degree of non-diagonality δ'/δ to ⅓ or less in a structure where the elastic supporting member supports the movable electrode at the outer periphery, as in the conventional microactuator 1000 (FIG. 10). On the other hand, the microactuator 10 of the present invention has a structure such that the elastic supporting member 5 supports the generally central portion O of the movable section 7, and, by further imposing on the spring moduli kz and kr and the distance L the relationship of:

$$0.5 \leq L^2 \cdot kz/kr \leq 2,$$

the degree of non-diagonality δ'/δ can be reduced to ⅓ or less. By thus reducing the non-diagonality, accuracy improvements and simplification of control of the microactuator 10 can be easily realized. Moreover, the control device for controlling the microactuator can have a simple structure.

Note that it is more desirable if the degree of non-diagonality δ'/δ is 1/10 or less. From (Table 1), by imposing on the spring moduli kz and kr and the distance L the relationship of:

$$0.82 \leq L^2 \cdot kz/kr \leq 1.2,$$

it becomes possible to reduce the degree of non-diagonality δ'/δ to 1/10 or less.

Although a case has been described where only the stationary electrode 4a generates a driving force, the above relationships can also be true in the case where each of the stationary electrodes 4a and 4b generates an arbitrary driving force. This will be described with reference to FIG. 2B. FIG. 2B shows a state in which independent voltages are applied to the stationary electrodes 4a and 4b to pull the movable electrode 6.

It is assumed that the driving force generated by the stationary electrode 4a is Fa(N), and that the driving force generated by the stationary electrode 4b is Fb(N). Moreover, it is assumed that displacement along the vertical direction of the movable electrode 6 at the point of application A is δa(m), and that the displacement along the vertical direction of the movable electrode 6 at the point of application B is δb(m). In this case, when Fb=0, it follows from (eq. 1) and (eq. 2) that:

$$\delta a=(1/kz+L^2/kr)Fa; \text{ and} \quad (eq.\ 8)$$

$$\delta b=(1/kz-L^2/kr)Fa. \quad (eq.\ 9)$$

When Fa=0, it follows from (eq. 1) and (eq. 2) that:

$$\delta a=(1/kz-L^2/kr)Fb; \text{ and} \quad (eq.\ 10)$$

$$\delta b=(1/kz+L^2/kr)Fb. \quad (eq.\ 11)$$

From (eq. 8) to (eq. 11), the relationship between the displacements δa and δb and the driving forces Fa and Fb is given by (eq. 12).

$$\begin{pmatrix} \delta a \\ \delta b \end{pmatrix} = \left( \frac{1}{kz} + \frac{L^2}{kr} \right) \begin{pmatrix} 1 & \frac{1-(L^2 \cdot kz/kr)}{1+(L^2 \cdot kz/kr)} \\ \frac{1-(L^2 \cdot kz/kr)}{1+(L^2 \cdot kz/kr)} & 1 \end{pmatrix} \begin{pmatrix} Fa \\ Fb \end{pmatrix} \quad \text{(eq. 12)}$$

In the matrix at the right-hand side of (eq. 12), the value of the ratio between the non-diagonal component and the diagonal component coincides with the degree of non-diagonality as has been described with reference to (eq. 7). From this, by imposing on the spring moduli kz and kr and the distance L the relationship of:

$$0.5 \leq L^2 \cdot kz/kr \leq 2,$$

it becomes possible to reduce the displacement interferences at the points of application A and B when arbitrary driving forces are generated by the stationary electrodes 4a and 4b (i.e., the interference of the driving force generated by the stationary electrode 4a with the displacement of the point of application B, and the interference of the driving force generated by the stationary electrode 4b with the displacement of the point of application A) to ⅓ or less, and enhance the independent controllability of displacements at the points of application A and B.

Moreover, if $L^2 \cdot kz/kr$ further satisfies the condition of:

$$1 \leq L^2 \cdot kz/kr,$$

then the non-diagonal terms in (eq. 12) will take negative values. This condition will facilitate the correction of displacements associated with non-diagonality in a structure where driving forces Fa and Fb only produce pulling forces, as in the case where electrostatic forces are employed as driving forces.

The reason for this will be described again referring to FIG. 2A.

In the case where the condition of:

$$1 \leq L^2 \cdot kz/kr$$

is satisfied, when one end of the movable electrode 6 at the point of application A side is displaced in a direction of approaching the base 1 due to the driving force Fa which is generated by driving the stationary electrode 4a, another end of the movable electrode 6 at the point of application B side will be displaced in a direction of becoming more distant from the base 1, and the displacement δ' at the point of application B due to non-diagonality will take a negative value. In order to correct this displacement, a pulling force may be generated by the stationary electrode 4b. In the case where the displacement δ' due to non-diagonality is generated in a direction of approaching the stationary electrode 4b, it would be very difficult to correct this displacement in a structure where only pulling force, e.g., electrostatic force, is generated. However, even in a structure where only pulling force is generated, if the displacement δ' due to non-diagonality occurs in a direction of becoming more distant from the stationary electrode 4b, correction of displacements associated with non-diagonality can be easily performed, basically by appropriately setting the sizes of the driving forces Fa and Fb. As a result, any control device which performs the correction of displacements associated with non-diagonality can have a simple structure.

Figure 3A:
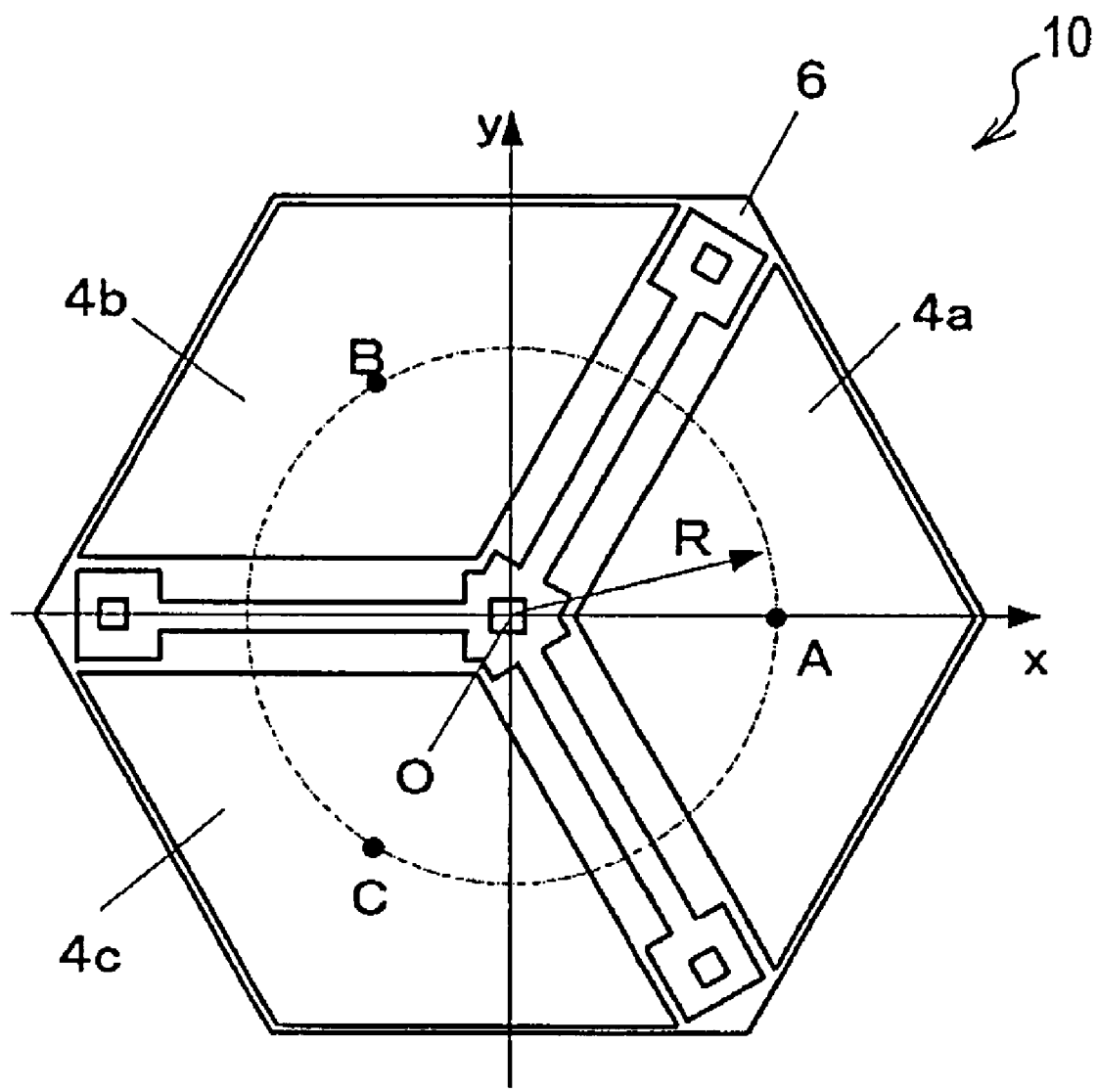
FIG. 3A A plan view schematically showing the microactuator according to Embodiment 1 of the present invention.
Figure 3B:
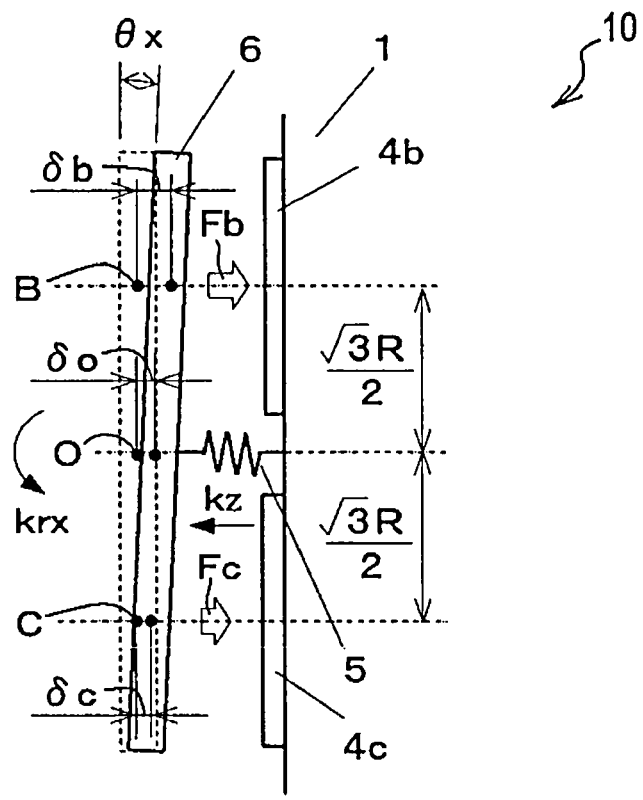
FIG. 3B An explanatory diagram of an operation of the microactuator according to Embodiment 1 of the present invention in a two-dimensional model.
Figure 3C:
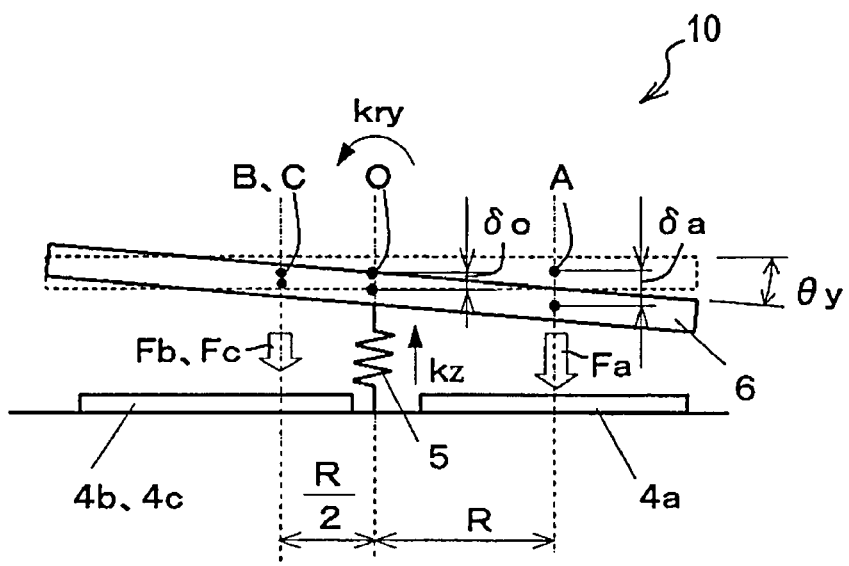
FIG. 3C An explanatory diagram of an operation of the microactuator according to Embodiment 1 of the present invention in a two-dimensional model.

Next, with reference to FIG. 3A to FIG. 3C, a two-dimensional model where bi-axial tilt and mono-axial vertical displacement take place will be described. FIG. 3A to FIG. 3C are explanatory diagrams of operations of the microactuator 10 under a two-dimensional model.

FIG. 3A is a plan view schematically the microactuator 10, where an x axis and a y axis, whose origin is at the central portion O of the movable electrode 6, are set as shown in FIG. 3A.

A point of application A of a driving force Fa that is exerted by the stationary electrode 4a on the movable electrode 6 of the movable section 7 is a point on an axis which extends through the center of a region of the stationary electrode 4a where the driving force Fa occurs and which is perpendicular to the stationary electrode 4a. A point of application B of a driving force Fb that is exerted by the stationary electrode 4b on the movable electrode 6 is a point on an axis which extends through the center of a region of the stationary electrode 4b where the driving force Fb occurs and which is perpendicular to the stationary electrode 4b. A point of application C of a driving force Fc that is exerted by the stationary electrode 4c on the movable electrode 6 is a point on an axis which extends through the center of a region of the stationary electrode 4c where the driving force Fc occurs and which is perpendicular to the stationary electrode 4c. The elastic supporting member 5 supports the movable electrode 6 at a position surrounded by the points of application A, B, and C (which in the present embodiment is a generally central portion of the movable electrode 6). In a linear approximation where the stationary electrode 4a and the movable electrode 6 are regarded as constituting parallel-plate electrodes, the point of application A is located at the center of a region of the movable electrode 6 that overlaps the stationary electrode 4a. The same is also true of the points of application B and C. Around the central portion O at which the elastic supporting member 5 supports the movable electrode 6, the stationary electrodes 4a to 4c are disposed so as to be rotation symmetrical. The distance of each of the points of application A to C from the central portion O is R(m). The points of application A to C are positioned on the circumference of a circle which has the radius R and is centered around the central portion O, and are positioned with equal angle intervals of 120° as viewed from the central portion O.

FIG. 3B is a schematic diagram of a cross section of the microactuator 10 along the y axis, and FIG. 3C is a schematic diagram of a cross section of the microactuator along the x axis. It is assumed that the stationary electrodes 4a, 4b, and 4c independently generate driving forces Fa, Fb, and Fc, whereby the movable electrode 6 is displaced, in a direction perpendicular to the base 1, by δa, δb, and δc at the points of application A, B, and C, respectively.

It is assumed that a spring modulus for the restoring force which occurs in the elastic supporting member 5 responsive to a vertical displacement δo(m) of the movable electrode 6 relative to the base 1 is kz(N/m); a spring modulus for the restoration torque which occurs in the elastic supporting member 5 responsive to a tilt angle θ x(rad) of a tilting of the movable electrode 6 around the x axis is krx(Nm/rad); and a spring modulus for the restoration torque which occurs in the elastic supporting member 5 responsive to a tilt angle θy(rad) of a tilting of the movable electrode 6 around the y axis is kry(Nm/rad).

The relationship between the displacements δa, δb, and δc and the driving forces Fa, Fb, and Fc is given by (eq. 13).

$$\begin{pmatrix} \delta a \\ \delta b \\ \delta c \end{pmatrix} = \begin{pmatrix} \frac{1}{kz} + \frac{R^2}{krx} & \frac{1}{kz} - \frac{R^2}{2krx} & \frac{1}{kz} - \frac{R^2}{2krx} \\ \frac{1}{kz} - \frac{R^2}{2krx} & \frac{1}{kz} + \frac{R^2}{4krx} + \frac{3R^2}{4kry} & \frac{1}{kz} + \frac{R^2}{4krx} - \frac{3R^2}{4kry} \\ \frac{1}{kz} - \frac{R^2}{2krx} & \frac{1}{kz} + \frac{R^2}{4krx} - \frac{3R^2}{4kry} & \frac{1}{kz} + \frac{R^2}{4krx} + \frac{3R^2}{4kry} \end{pmatrix} \begin{pmatrix} Fa \\ Fb \\ Fc \end{pmatrix} \quad \text{(eq. 13)}$$

In (eq. 13), by approximating the value of $R^2 \cdot kz/krx$ to two and approximating the value of krx to the value of kry, it becomes possible to reduce all non-diagonal components to a desired value. From this, by allowing the elastic supporting member 5 to support the central portion O of the movable electrode 6, and imposing a specific relationship on R, kz, krx, and kry, it becomes possible to reduce the displacement interferences at the points of application A to C when arbitrary driving forces are generated by the stationary electrodes 4a to 4c to a predetermined value or less, and enhance the independent controllability of displacements at the points of application A to C.

Examples of conditions for R, kz, krx, and kry that are necessary for reducing the non-diagonality are shown in (Table 2).

TABLE 2

| Degree of non-diagonality | Example conditions for R, kz, krx, kry |
|---|---|
| 0.33 ... (=⅓) | $1 \leq R^2 \cdot kz/krx \leq 5$ |
|  | $1 \leq R^2 \cdot kz/kry \leq 5$ |
|  | $0.67 \leq krx/kry \leq 1.5$ |
| 0.25 | $1.1 \leq R^2 \cdot kz/krx \leq 4$ |
|  | $1.1 \leq R^2 \cdot kz/kry \leq 4$ |
|  | $0.71 \leq krx/kry \leq 1.4$ |
| 0.2 | $1.3 \leq R^2 \cdot kz/krx \leq 3.3$ |
|  | $1.3 \leq R^2 \cdot kz/kry \leq 3.3$ |
|  | $0.77 \leq krx/kry \leq 1.3$ |
| 0.1 | $1.6 \leq R^2 \cdot kz/krx \leq 2.5$ |
|  | $1.6 \leq R^2 \cdot kz/kry \leq 2.5$ |
|  | $0.87 \leq krx/kry \leq 1.15$ |

By the elastic supporting member 5 supporting the generally central portion O of the movable electrode 6, and by imposing on the spring moduli kz, krx, and kry and the distance R the relationships of:

$1 \leq R^2 \cdot kz/krx \leq 5;$ $1 \leq R^2 \cdot kz/kry \leq 5;$ and $0.67 \leq krx/kry \leq 1.5,$ it becomes possible to reduce the degree of non-diagonality to ⅓ or less in a microactuator 10 having freedom along three axes including mono-axial vertical displacement and bi-axial tilt.

Note that it is more desirable if the degree of non-diagonality is 1/10 or less. From (Table 2), by imposing on the spring moduli kz, krx, and kry and the distance R the relationships of:

$1.6 \leq R^2 \cdot kz/krx \leq 2.5;$ $1.6 \leq R^2 \cdot kz/kry \leq 2.5;$ and $0.87 \leq krx/kry \leq 1.15,$ it becomes possible to reduce the degree of non-diagonality δ'/δ to 1/10 or less.

Moreover, if the $R^2$ kz/kr further satisfies the conditions of:

$2 \leq R^2 \cdot kz/krx;$ and $2 \leq R^2 \cdot kz/kry,$ it becomes possible to facilitate the correction of displacements associated with non-diagonality even in the case where only pulling forces are generated as driving forces Fa to Fc, as has been described with respect to a one-dimensional model.

Figure 4:
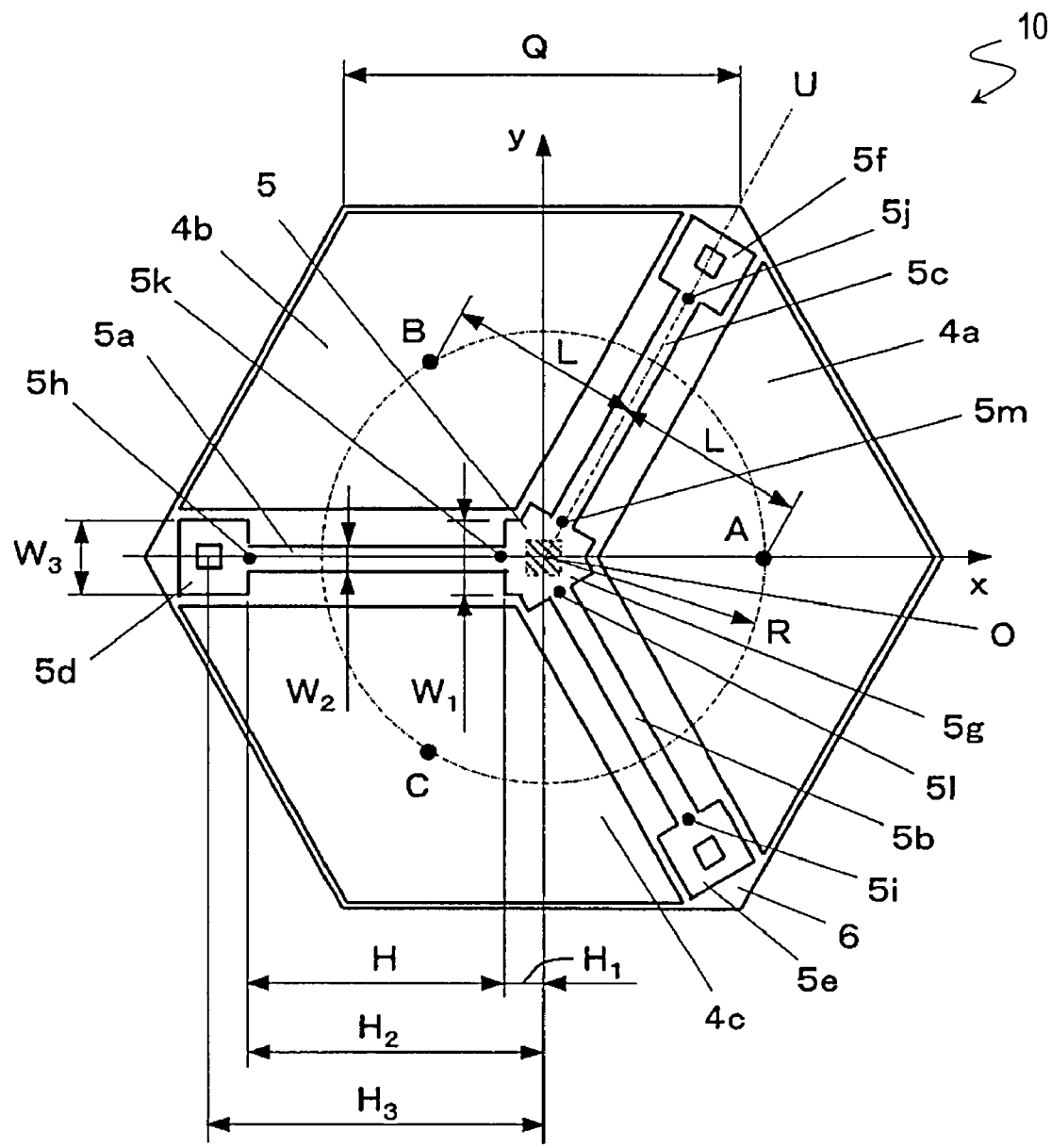
FIG. 4 A plan view schematically showing a microactuator according to Embodiment 1 of the present invention.

Next, with reference to FIG. 4, specific dimension values for the microactuator 10 for satisfying the aforementioned conditions will be described. FIG. 4 is a plan view schematically showing the microactuator 10.

The central portion O, the points of application A to C, and the distance R have been described with respect to FIG. 3A, and the descriptions thereof are omitted here. The distance R in the microactuator 10 shown in FIG. 4 is 37 μm. A distance $H_1$ from the central portion O to the movable end 5k of the elastic supporting member 5 is 5.5 μm; a distance $H_2$ from the central portion O to the stationary end 5h of the elastic supporting member 5 is 45.5 μm; and a distance $H_3$ from the central portion O to the center of the fixture portion 5d of the elastic supporting member 5 is 51 μcm. The support portion 5g has a width $W_1$ of 11 μm; the elastic beam 5a has a width $W_2$ of 4 μm; and the fixture portion 5d has a width $W_3$ of 11 μm. The thickness of the elastic supporting member 5 is preferably in the range from 0.1 to 1 μm, and is 0.5 μm herein. In the case where the material of the elastic supporting member 5 is an aluminum alloy (e.g., aluminum silicon), the Young's modulus is 69 GPa and the Poisson's ratio is 0.35.

The stationary end 5h, which is the end that is connected to the base 1, is located more to the outside than is the movable end 5k, which is the end that is connected to the movable electrode 6, and the distance between the stationary end 5h and the central portion O is longer than the distance between the movable end 5k and the central portion O. Along the elastic beam 5a extending from the stationary end 5h to the movable end 5k, the linear distance between the two farthermost points thereof is defined as H. Herein, the distance H is equal to the length of the elastic beam 5a, and is 40 cm. Since the values of kr/krx and kr/kry are approximately in inverse proportion with the distance H raised to the second power, it is possible to obtain desired values of kz/krx and kr/kry by appropriately adjusting the value of the distance H. It is preferable to determine the relationship between the distance H and the distance R so as to satisfy:

$0.8 \leq H/R \leq 1.6.$

Under the aforementioned values of H and R (H=40 μm, R=37 μm), the value of H/R is 1.08, thus satisfying the relationship of:

$0.8 \leq H/R \leq 1.6.$

An elastic supporting member 5 having the aforementioned values exhibited characteristics such that: kz=1.16 (N/m), krx=7.29×10⁻¹⁰ (Nm/rad), and kry=7.90×10⁻¹⁰ (Nm/rad). Herein, the values of $R^2 \cdot kz/krx$, $R^2 \cdot kz/kry$, and krx/kry are 2.18, 2.02, and 1.08, respectively, thus satisfying the conditions of:

$$1 \leq R^2 \cdot kz/krx \leq 5;$$

$$1 \leq R^2 \cdot kz/kry \leq 5; \text{ and}$$

$$0.67 \leq krx/kry \leq 1.5.$$

Through calculations based on (eq. 13), it can be seen that the non-diagonality would be 3% or less under these conditions. Thus, according to the present invention, it is possible to realize a microactuator having a very small non-diagonality.

Note that each side of the movable electrode 6 has a length Q of 62 µm, ensuring that the stationary electrodes 4a to 4c and the elastic supporting member 5 are all disposed under the plane region of the movable electrode 6.

Now, it will be described how the condition:

$$0.5 \leq L^2 \cdot kz/kr \leq 2,$$

which has been described by using a one-dimensional model, is also applicable to a two-dimensional model.

When one pays attention to the two stationary electrodes 4a and 4b, the stationary electrodes 4a and 4b are in such a planar positioning that they are allocated to opposite sides of a tilt axis U (FIG. 4) which extends through the central portion O. The restoration torque kr with respect to the tilt axis U is equal to krx, and the distance L between each of the points of application A and B and the tilt axis U is equal to $\sqrt{3}R/2$. In this case, $L^2 \cdot kz/kr$ is 1.58, thus satisfying the condition of:

$$0.5 \leq L^2 \cdot kz/kr \leq 2.$$

As described above, according to the present embodiment, by allowing the central portion O of the movable electrode 6 of the movable section 7 to be supported by the elastic supporting member 5, and imposing a specific relationship between the spring moduli responsive to vertical displacements and tilt angles of the movable section 7, it becomes possible to reduce the non-diagonality between driving force and displacement.

In the present embodiment, the movable section 7 includes movable electrodes 6, such that the stationary electrodes 4a to 4c which form pairs of parallel-plate electrodes with the movable electrode 6 function as driving sections for driving the movable section 7. However, the present invention is not limited thereto. The driving sections may be any elements that generate driving forces for the movable section in a direction perpendicular to the base 1. For example, the stationary electrodes 4a to 4c and the movable electrode 6 may constitute pairs of vertical comb-like electrodes. Moreover, the driving sections may be any elements that generate driving forces other than electrostatic forces, e.g., electromagnetic forces other than electrostatic forces. Such driving forces are preferably non-contact forces, but they may also be contact forces as long as they do not introduce a large disturbance in the specific relationship between the spring moduli kz, kr, krx, and kry and the distances L and R.

The microactuator 10 of the present embodiment is capable of bi-axial tilt and mono-axial vertical displacement. However, as is clear from the description of the principles in a one-dimensional model, it will be appreciated that the present invention is also applicable to a microactuator which is capable of mono-axial tilt and mono-axial vertical displacement.

Although the microactuator 10 of the present embodiment has a planar shape in which the respective constituent elements are disposed symmetrically around the central portion O, the present invention is not limited thereto. According to the present invention, it is possible to obtain the effect of reducing non-diagonality even in a structure in which the constituent elements are not in symmetric arrangement.

Embodiment 2

Figure 5A:
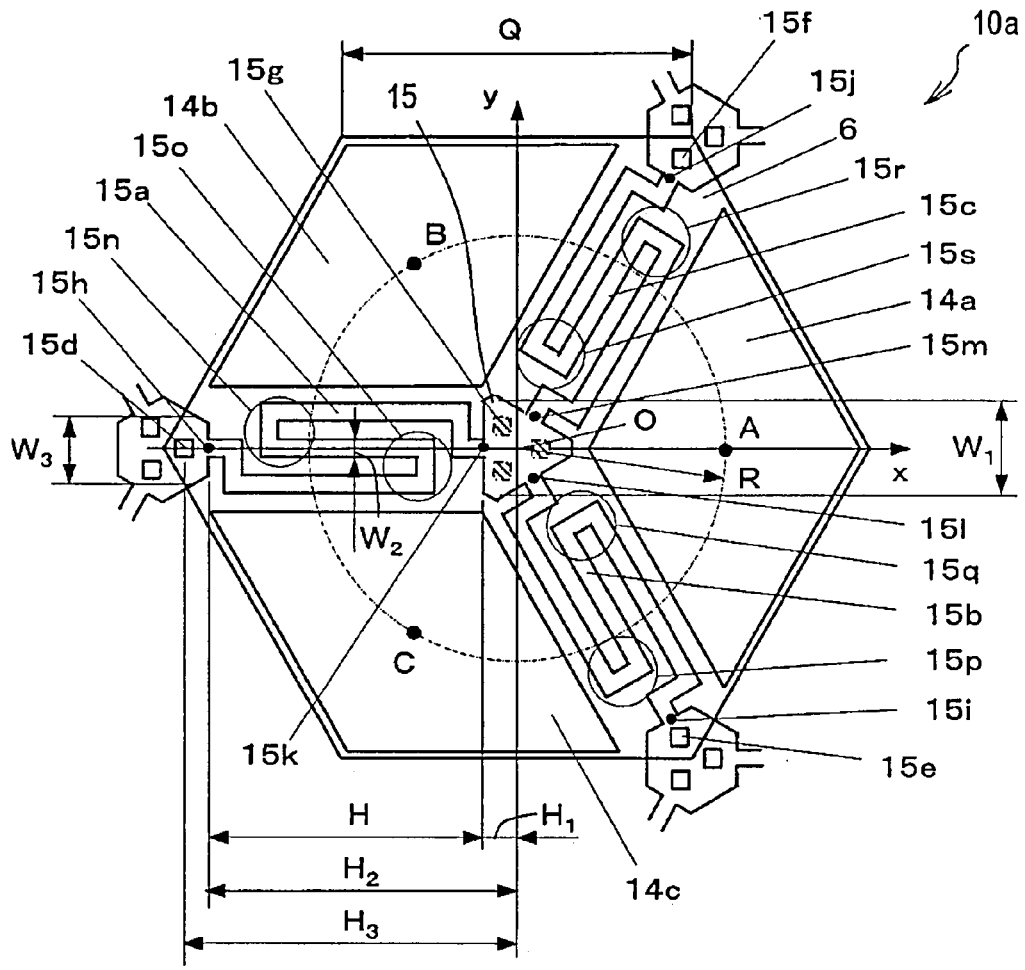
FIG. 5A A plan view schematically showing a microactuator according to Embodiment 2 of the present invention.
Figure 5B:
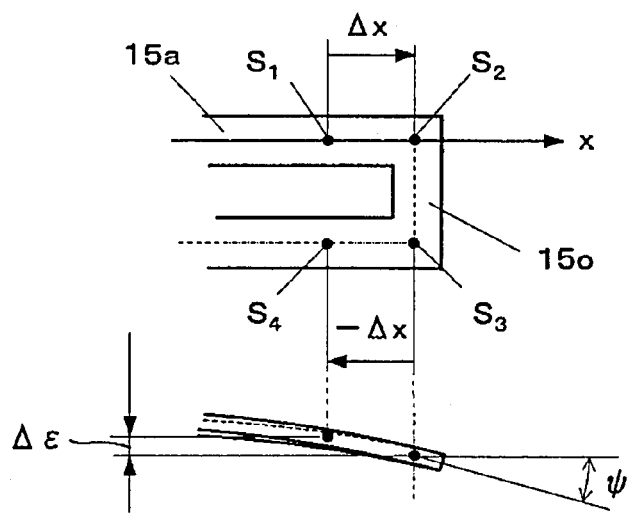
FIG. 5B Enlarged views of the neighborhood of a turn-back portion of an elastic beam of the microactuator according to Embodiment 2 of the present invention.

With reference to FIG. 5A and FIG. 5B, a second embodiment of the microactuator according to the present invention will be described.

First, FIG. 5A will be referred to. FIG. 5A is a plan view schematically showing a microactuator 10a of the present embodiment.

The microactuator 10a comprises an elastic supporting member 15 instead of the elastic supporting member 5 of the microactuator 10 of Embodiment 1, and comprises stationary electrodes 14a to 14c instead of the stationary electrodes 4a to 4c. The planar shape of the elastic supporting member 15 is a meander shape, such that elastic beams 15a to 15c of the elastic supporting member 15 have turn-back portions 15n to 15s where the direction in which each beam extends is reversed by about 180°.

The stationary electrodes 14a to 14c have a smaller area than do the stationary electrodes 4a to 4c, this being in order to allow for occupancy by the elastic supporting member 15. As a result of this, the points of application A to C are located farther away from the central portion O (R=39 µm).

The elastic supporting member 15 includes three elastic beams 15a to 15c, fixture portions 15d to 15f for affixing these elastic beams 15a to 15c to a base 1 (FIG. 1A), and a support portion 15g for supporting a movable section 7 (FIG. 1A). Among the end portions of the elastic beams 15a to 15c, those end portions which are connected to the fixture portions 15d to 15f will be referred to as stationary ends 15h to 15J, whereas those end portions which are connected to the support portion 15g will be referred to as movable ends 15k to 15m.

Herein, the planar shape of the elastic supporting member 15 will be described by paying attention to the elastic beam 15a. The elastic beam 15a has a meander shape, and includes two turn-back portions 15n and 15o where the direction in which each beam extends is turned back by about 180°. By assigning a meander shape to the elastic beam 15a, the substantial beam length is elongated and the spring moduli kz, krx, and kry are reduced, thus making it possible to obtain a large displacement with low voltage driving.

Herein, a distance $H_1$ from the central portion O to the movable end 15k is 5.5 µm; a distance $H_2$ from the central portion O to the stationary end 15h is 51.5 µm; and a distance $H_3$ from the central portion O to the center of the fixture portion 15d is 57 µm. Moreover, the support portion 15g has an effective width $W_1$ of 13 µm; the elastic beam 15a has a width $W_2$ of 3 µm; and the fixture portion 15d has a width $W_3$ of 11 µm. The thickness of the elastic supporting member 15 is preferably in the range from 0.1 to 1 µm, and is 0.5 µm herein. In the case where the material of the elastic supporting member 15 is an aluminum alloy, the Young's modulus is 69 GPa and the Poisson's ratio is 0.35.

Along the elastic beam 15a, the distance H between the two farthermost points thereof is equal to the linear distance between the stationary end 15h and the movable end 15k, and is 46 µm. In the case where H and R have these values (H=46

μm, R=39 μm), the value of H/R is 1.18, thus satisfying the relationship of:

$$0.8 \leq H/R \leq 1.6.$$

The beam overall length of the elastic beam 15a is 120 μm, which is 2.61 times as large as the distance H.

The fixture portions 15d to 15f may be formed integrally with the fixture portions of any adjoining microactuator. The support portion 15g is connected with the movable electrode 6 at three sites which are shown hatched in FIG. 5A. The reason for employing three connection sites is in order to further enhance the connection strength between the movable electrode 6 and the elastic supporting member 15. The positions of the connection sites may be anywhere on the generally central portion O. Each side of the movable electrode 6 has a length Q of 62 μm.

An elastic supporting member 15 having the aforementioned values exhibited characteristics such that: kz=0.34 (N/m), krx=2.34×10⁻¹⁰ (Nm/rad), and kry=2.57×10⁻¹⁰ (Nm/rad). Herein, the values of $R^2 \cdot kz/krx$, $R^2 \cdot kz/kry$, and krx/kry are 2.19, 2.00, and 1.10, respectively, thus satisfying the conditions of:

$$1 \leq R^2 \cdot kz/krx \leq 5;$$

$$1 \leq R^2 \cdot kz/kry \leq 5; \text{ and}$$

$$67 \leq krx/kry \leq 1.5.$$

The effects obtained from assigning meander shapes to the elastic beams 15a to 15c will be described in comparison with the case where the elastic beams have linear shapes.

In the case where the elastic beams have linear shapes, if the length of each beam is increased to n times as much in order to reduce the spring modulus of the elastic beam, then the spring modulus kr (or krx, kry) concerning the tilt angle becomes approximately 1/n, so that the spring modulus kz concerning vertical displacement becomes approximately 1/n³. Thus, kz/kr, which is a value of the ratio between kr and kz, becomes approximately 1/n². In other words, the value of kz/kr rapidly decreases with an increase in n, and therefore it is difficult to satisfy the conditions of:

$$5 \leq L^2 \cdot kz/kr \leq 2, \text{ or}$$

$$1 \leq R^2 \cdot kz/krx \leq 5; \text{ and}$$

$$1 \leq R^2 \cdot kz/kry \leq 5.$$

On the other hand, in the case where the elastic beams have meander shapes, it is possible to increase the substantial beam overall length to n times as much by turning back the beams a plurality of times, while substantially maintaining the length of the distance H so as to condition:

$$0.8 \leq H/R \leq 1.6.$$

In this case, the spring modulus kr (or krx, kry) concerning the tilt angle becomes approximately 1/n, and the spring modulus kz concerning vertical displacement also becomes approximately 1/n. Therefore, the value of the ratio kz/kr between kr and kz becomes substantially constant, with hardly any dependence on n. Therefore, in the case where the elastic beams have meander shapes, it is possible to reduce the spring modulus merely by increasing the number of turn-backs in each beam, while satisfying the conditions of:

$$0.5 \leq L^2 \cdot kz/kr \leq 2, \text{ or}$$

$$1 \leq R^2 \cdot kz/krx \leq 5; \text{ and}$$

$$1 \leq R^2 \cdot kz/kry \leq 5.$$

The reason why, in the case where the elastic beams have meander shapes, the spring modulus kz concerning vertical displacement changes in proportion with 1/n, as opposed to 1/n³, will be described with reference to FIG. 5B.

FIG. 5B is enlarged views of the neighborhood of the turn-back portion 15o of the elastic beam 15a. The upper view is a plan view of the turn-back portion 15o, whereas the lower view is a side view of the turn-back portion 15o.

Assuming that the elastic beam 15a has a flex angle of ψ at the turn-back portion 15o, the amount of change $\Delta \in (S_1 \rightarrow S_2)$ in vertical displacement, responsive to a minute displacement Δx from points $S_1$ to $S_2$, is ψΔx.

When an amount of change $\Delta \in (S_3 \rightarrow S_4)$ in vertical displacement responsive to a minute displacement (−Δx) from points $S_3$ to $S_4$ is considered, there exists a term (−ψΔx). Therefore, when a vertical displacement from points $S_1$ to $S_4$ is considered, the ψ terms are cancelled so that higher-order terms ΔψΔx are left.

Thus, since the direction in which the elastic beam extends is reversed at a turn-back portion, a portion of the vertical displacement associated with a flex angle component of the elastic beam is partially cancelled to become smaller. As a result, the characteristics of the spring modulus kz can be brought closer to 1/n than 1/n³.

As described above, according to the present embodiment, since the elastic supporting member 15 has turn-back portions 15n to 15s where the direction in which each beam extends is reversed, the rigidity of the beams can be decreased while hardly changing the value of the ratio between the spring modulus kz and the spring modulus kr. As a result, the effect of reducing non-diagonality and the effect of obtaining a large displacement of the movable section 7 with low voltage driving can both be obtained.

Embodiment 3

Figure 6A:
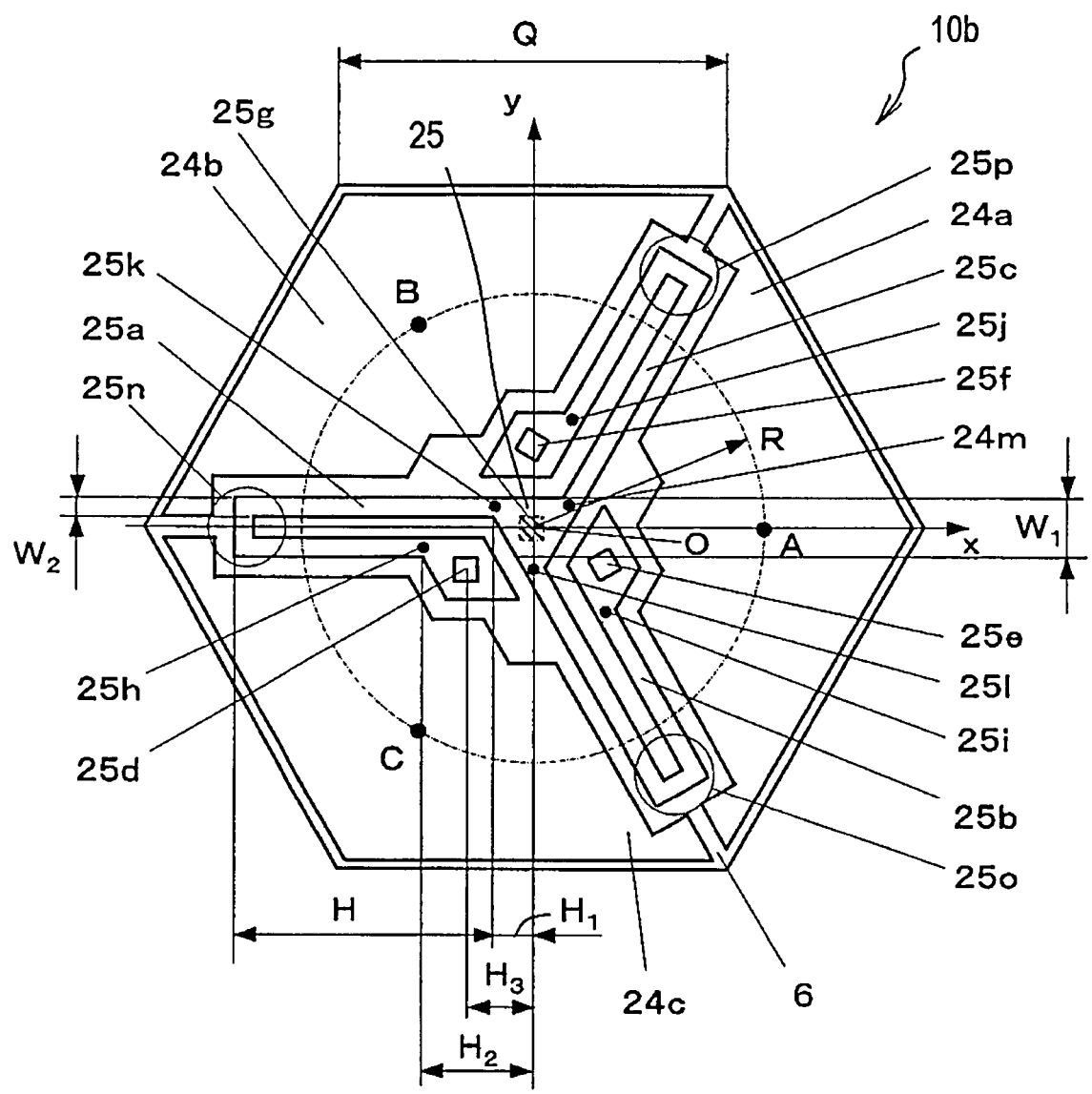
FIG. 6A A plan view schematically showing a microactuator according to Embodiment 3 of the present invention.
Figure 6B:
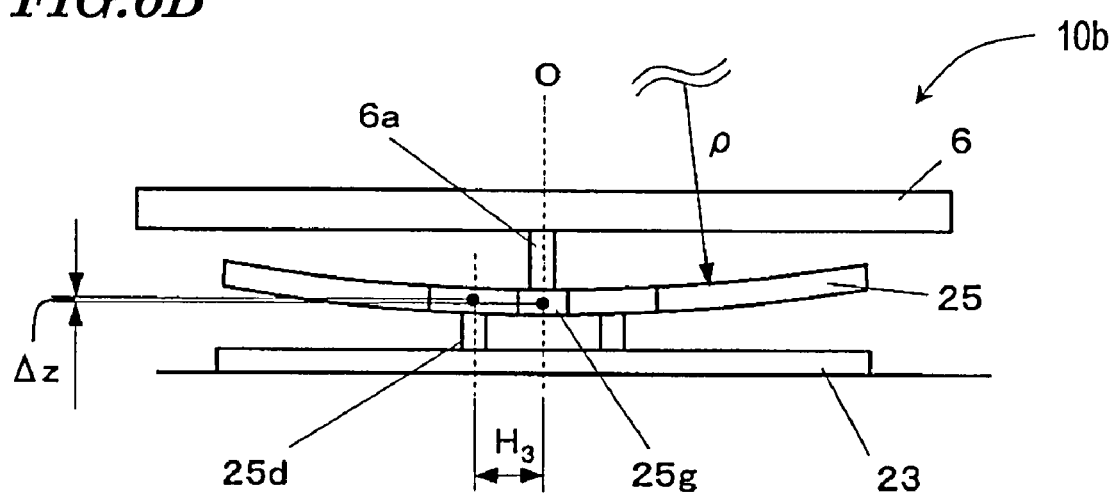
FIG. 6B A side view schematically showing the microactuator according to Embodiment 3 of the present invention in a state where its elastic supporting member is warped.

With reference to FIG. 6A and FIG. 6B, a third embodiment of the microactuator according to the present invention will be described.

First, FIG. 6A will be referred to FIG. 6A is a plan view schematically showing a microactuator 10b of the present embodiment.

The microactuator 10b comprises an elastic supporting member 25 instead of the elastic supporting member 15 of the microactuator 10a of Embodiment 2, and comprises stationary electrodes 24a to 24c instead of the stationary electrodes 14a to 14c. Stationary ends 25h to 25j of the elastic supporting member 25 are disposed in positions which are closer to the central portion O than are turn-back portions 25n to 25p.

The stationary electrodes 24a to 24c are disposed in positions such that a distance R between points of application A to C and the central portion O is 38.5 μm.

The elastic supporting member 25 includes three elastic beams 25a to 25c, fixture portions 25d to 25f for affixing these elastic beams 25a to 25c to a base 1 (FIG. 1A), and a support portion 25g for supporting a movable section 7 (FIG. 1A). Among the end portions of the elastic beams 25a to 25c, those end portions which are connected to the fixture portions 25d to 25f will be referred to as stationary ends 25h to 25j, whereas those end portions which are connected to the support portion 25g will be referred to as movable ends 25k to 25m.

Herein, the planar shape of the elastic supporting member 25 will be described by paying attention to the elastic beam 25a. The elastic beam 25a has a meander shape, and includes an odd number (which herein is one) of turn-back portions 25n where the direction in which each beam extends is turned back by about 180°. The distance between the turn-back portion 25n and the central portion O is longer than the distance between the fixture portion 25d and the central portion O.

Herein, a distance $H_1$ from the central portion O to the movable end 25k is 6 μm; a distance $H_2$ from the central portion O to the stationary end 25h is 17.5 μm; and a distance $H_3$ from the central portion O to the center of the fixture portion 25d is 10 μm. Moreover, the support portion 25g has an effective width $W_1$ of 9 μm, and the elastic beam 25a has a width $W_2$ of 3 μm. The thickness of the elastic supporting member 25 is preferably in the range from 0.1 to 1 μm, and is 0.5 μm herein. In the case where the material of the elastic supporting member 25 is an aluminum alloy, the Young's modulus is 69 GPa and the Poisson's ratio is 0.35.

Along the elastic beam 25a, the distance H between the two farthermost points thereof is 41.5 μm, which corresponds to the distance between the movable end 25k and the turned portion 25n in the present embodiment. In the case where H and R have these values (H=41.5 μm, R=38.5 μm), the value of H/R is 1.08, thus satisfying the relationship of:

$$0.8 \leq H/R \leq 1.6.$$

The beam overall length of the elastic beam 25a is 74.5 μm, which is 1.8 times as large as the distance H.

An elastic supporting member 25 having the aforementioned values exhibited characteristics such that: kz=0.55 (N/m), krx=3.70×10$^{-10}$ (Nm/rad), and kry=4.08×10$^{-10}$ (Nm/rad). Herein, the values of $R^2 \cdot kz/krx$, $R^2 \cdot kz/kry$, and krx/kry are 2.20, 2.00, 1.10, respectively, thus satisfying the conditions of:

$$1 \leq R^2 \cdot kz/krx \leq 5;$$

$$1 \leq R^2 \cdot kz/kry \leq 5; \text{ and}$$

$$0.67 \leq krx/kry \leq 1.5.$$

Referred to FIG. 6B, the effects obtained by disposing the stationary ends 25h to 25j of the elastic supporting member 25 in positions which are closer to the central portion O than are the turn-back portions 25n to 25p will be described.

FIG. 6B is a side view schematically showing a state in which the elastic supporting member 25 is warped.

The elastic supporting member 25 may have warpage due to a residual stress gradient or the like which occurs during the film formation process, for example. Due to the influence of such warpage, a height error Δz along the vertical direction may occur between the support portion 25g and the fixture portion 25d. Assuming that the warpage has a radius of curvature of ρ, Δz is expressed as, by approximation:

$$\Delta z = H_3^2/(2\rho).$$

Therefore, the more the distance $H_3$ from the central portion O to the center of the fixture portion 25d is reduced, the more the height error Δz can be reduced, in proportion with the distance $H_3$ raised to the second power. By disposing the stationary ends 25h to 25j to positions which are closer to the central portion O than are the turn-back portions 25n to 25p, the distance $H_3$ can be reduced.

As described above, according to the present embodiment, the stationary ends 25h to 25j of the elastic supporting member 25 are disposed in positions which are closer to the central portion O than are the turn-back portions 25n to 25p. As a result, even if warpage occurs in the elastic supporting member 25 due to a residual stress gradient or the like which occurs during the film formation process, for example, the height error Δz of the movable electrode 6 along the vertical direction can be kept small. It will also be appreciated that the effect of reducing non-diagonality and the effect of obtaining a large displacement of the movable section 7 with low voltage driving as described in Embodiment 2 are also obtained.

Embodiment 4

With reference to FIG. 7 to FIG. 9B, an embodiment of an apparatus which comprises microactuators according to the present invention will be described.

Figure 7:
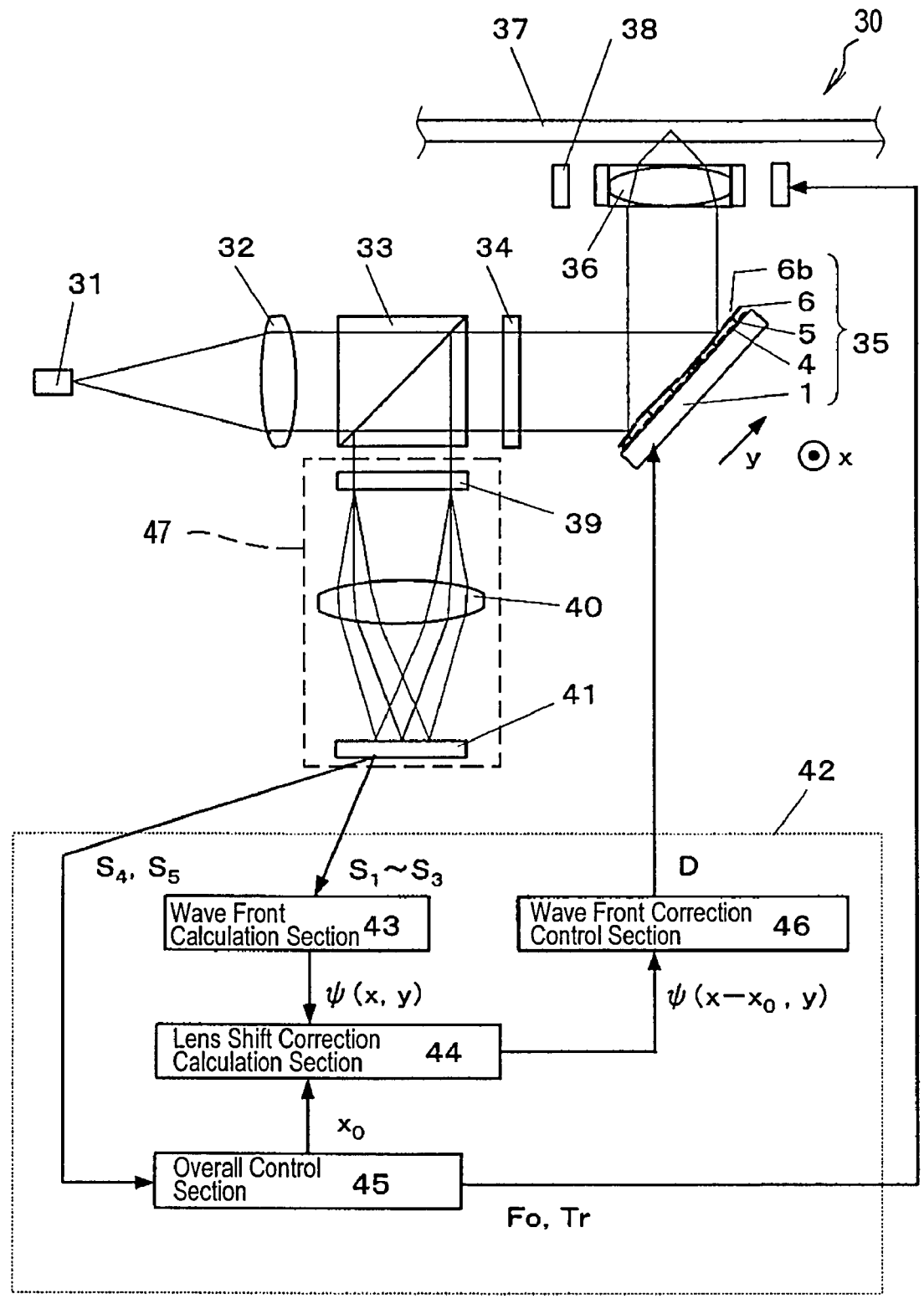
FIG. 7 A diagram schematically showing an apparatus incorporating microactuators according to Embodiment 4 of the present invention.

First, FIG. 7 will be referred to FIG. 7 is a diagram schematically showing an apparatus 30 comprising microactuators according to the present embodiment. An apparatus comprising microactuators according to the present invention may be, for example, an optical pickup or an optical disk apparatus which performs recording/reproduction of information for an optical disk, but is not limited thereto. As an example of an apparatus comprising the microactuator according to the present invention, the apparatus 30, which is an optical disk apparatus, will be described.

The apparatus 30 comprises a light source 31, a collimator lens 32, a polarization beam splitter 33, a ¼ wavelength plate 34, a microactuator array 35, an objective lens 36, an objective lens actuator 38, a wave front information generation section 47, and a control section 42.

As has been described with reference to FIG. 1B, the microactuator array 35 includes a plurality of microactuators 10. Note that the microactuator array 35 may comprise a plurality of microactuators 10a or 10b instead of the microactuators 10, or comprise a combination of the microactuators 10, 10a, and 10b.

The control section 42 outputs control signals to the stationary electrodes 4a to 4c as driving voltages, thus controlling the displacement (vertical displacement and tilt) of the movable section 7. The control section 42 causes the movable section 7 to be displaced to a desired posture, thus modulating the wave front of light which enters the mirror section 6b.

Next, the operation of the apparatus 30 will be described in more detail.

The light source 31 is a GaN laser device, for example. A light beam which is emitted from the light source 31 is converted by the collimator lens 32 into a light beam of an infinite system, and enters the polarization beam splitter 33. In this light beam, only the P-polarized light component is transmitted through the polarization beam splitter 33, whereas the remaining S-polarized light component is reflected so as to enter a front light monitor (not shown). The transmitted P-polarized light component is converted by the ¼ wavelength plate 34 into circularly polarized light.

On the microactuator array 35, a plurality of microactuators 10 are arranged in a two-dimensional array. Each movable section 7 includes a mirror section 6b which is a light reflecting surface, and reflects a light beam. The movable section 7 is displaced in accordance with the sizes of the voltages applied to the stationary electrodes 4a to 4c, and causes local changes in the wave front of the light beam. The incident angle and the outgoing angle of light with respect to the microactuator array 35 are each prescribed to be 45°.

The light beam whose wave front has been changed by the microactuator array 35 is converged by the objective lens 36 onto a recording layer of the disk 37. The objective lens actuator 38 translates the objective lens 36 in two directions, i.e., an optical axis direction of the light beam and a direction perpendicular to the optical axis, so as to realize focusing of the light beam onto a desired recording layer, as well as tracking along a desired recording track.

The disk 37 is an optical storage medium having a plurality of recording layers that are disposed at predetermined intervals, and a substrate portion which covers the recording layer for protection and which is capable of transmitting light. In order to prevent loss of aberration information concerning odd symmetric aberrations in the forth and return paths, it would be more preferable to allow the recording layer to have diffusing properties or fluorescence. The light beam which has been reflected at the recording layer of the disk 37 again passes through the mirror sections 6b of the microactuator array 35 and the ¼ wavelength plate 34. Since most of this light beam is an S-polarized light component, it is reflected by the polarization beam splitter 33, and enters the wave front information generation section 47. The wave front information generation section 47 generates wave front information indicating the wave front state of the light beam. The wave front information generation section 47 includes a hologram 39, a lens 40, and a photodetector 41. Although the wave front information generation section 47 is herein illustrated as being a modal-type wave front sensor, it may also be a Shack-Hartmann type wave front sensor, or any other aberration detection method may be used, e.g., that which is described in Japanese Laid-Open Patent Publication No. 2000-155979. A modal-type wave front sensor is disclosed in the following publication.

M. A. A. Neil, M. J. Booth, and T. Wilson, "New modal wave-front sensor: a theoretical analysis," J. Opt. Soc. Am. A/Vol. 17, No. 6, pp. 1098-1107 (2000)

In n (where n is plural) orthogonal aberration modes Mi (i=1 to n), the hologram 39 generates $\pm 1^{st}$ order light in respectively different directions. For the $\pm 1^{st}$ order light corresponding to each mode Mi, a bias aberration of +BiMi is imparted to $+1^{st}$ order light and a bias aberration of −BiMi to St order light, given a predetermined bias coefficient Bi.

The lens 40 converges n pairs of light beams, which have been deflected by the hologram 39, onto the photodetector 41. Assuming that the lens 40 has a focal length f, the hologram 39 and the photodetector 41 are each disposed in a position at the distance f from the principal plane of the lens 40, and the lens 40 functions as a Fourier transform lens.

With respect to each of the n pairs of light beams, the photodetector 41 generates differential output signals Si, which are intensity signals of $\pm 1^{st}$ order light, and output them to the control section 42. A differential output signal Si corresponding to an aberration mode Mi is a signal corresponding to a size Ai of the aberration mode Mi. A sensitivity Si/Ai with respect to the aberration mode Mi is predetermined according to design parameters such as the bias coefficient Bi.

A differential output signal Si represents wave front information, such that the amplitude of the differential output signal Si represents the wave front state of the light beam. A differential output signal $S_1$ is an output signal concerning a spherical aberration mode associated with changes in the substrate thickness of the disk 37. A differential output signal $S_2$ is an output signal concerning an aberration mode mainly corresponding to a coma associated with a tilt of the disk 37 in a radial direction. A differential output signal $S_3$ is an output signal concerning an aberration mode mainly corresponding to a coma associated with a tilt of the disk 37 in a tangential direction. The differential output signal S4 is an output signal concerning the aberration mode of the objective lens 36 due to defocusing. A differential output signal $S_5$ is a signal which has been modulated by the prepits and recording marks on the disk 37.

The control section 42 causes the movable section 7 to be displaced in accordance with the wave front information represented by the differential output signals Si. The control section 42 includes a wave front calculation section 43, a lens shift correction calculation section 44, an overall control section 45, and a wave front correction control section 46. In a preferable embodiment, the control section 42 or a portion thereof is provided on the base 1 of the microactuator array 35, and the control section 42 and the microactuator array 35 are implemented as a single chip.

In another preferable embodiment, the light source 31, the collimator lens 32, the polarization beam splitter 33, the ¼ wavelength plate 34, the microactuator array 35, the objective lens 36, the objective lens actuator 38, and the wave front information generation section 47 are disposed on an optical pickup base (not shown). In this case, the optical pickup base may double as the base 1. Moreover, the control section 42 or a portion thereof may be provided on the optical pickup base.

The wave front calculation section 43 calculates a phase function $\psi(x,y)$ for correcting a wave front aberration associated with a change in the substrate thickness of the disk 37 and its tilt, by using the differential output signals $S_1$ to $S_3$. Herein, x and y are coordinates corresponding to a mirror position in the microactuator array 35.

The lens shift correction calculation section 44 receives the value of a lens shift amount $x_0$ of the objective lens 36 from the overall control section 45, and based on this, converts the phase function $\psi(x,y)$ into $\psi(x-x_0,y)$. This $\psi(x-x_0,y)$ serves as a target wave front when the wave front correction control section 46 controls the microactuator array 35.

Based on the differential output signals $S_4$ and $S_5$, the overall control section 45 generates a focusing control signal Fo and a tracking control signal Tr, and outputs them to the objective lens actuator 38. Moreover, the overall control section 45 calculates the lens shift amount $x_0$ of the objective lens 36 by allowing the generated tracking control signal Tr to pass through a low-pass filter.

From the lens shift correction calculation section 44, the wave front correction control section 46 receives a signal representing $\psi(x-x_0,y)$, and generates a control signal D for controlling the displacement of each movable section 7 of the microactuator array 35 in accordance with $\psi(x-x_0,y)$.

The microactuator array 35 includes 42×36 microactuators 10, for example. In this case, since each microactuator 10 includes three stationary electrodes 4a to 4c, the microactuator array 35 includes 42×36×3 stationary electrodes. The control signal D represents the size of each driving voltage to be individually supplied to each of the 42×36×3 stationary electrodes. In accordance with a target displacement amount for a point of application of the driving force which is exerted on the movable section 7 by a stationary electrode receiving the control signal D, the wave front correction control section 46 sets the size of the driving voltage to be supplied to that stationary electrode. Moreover, the wave front correction control section 46 sets the size of the driving voltage in multiple steps, so that the point of application is capable of displacement in multiple steps of three or more (e.g., 128 steps=7 bits). Moreover, since a non-linear relationship generally exists between the driving voltage supplied to a stationary electrode and the displacement of the movable section 7, it is possible to perform a correction process for obtaining linear displacement by allowing the control signal D to have a high resolution (e.g., 10 bits). The control signal D is to be switched in time series.

Assuming that there are n steps in the target displacement amount at each point of application in the movable section 7, if the degree of non-diagonality $\delta'/\delta$ is 1/n or less, the wave front correction control section 46 does not need perform any correction for the displacements associated with non-diagonality, so that the control structure can be made very simple. Since the degree of non-diagonality $\delta'/\delta$ is small in the microactuator 10 of the present invention, the control structure can be simplified even when a large number (e.g., 42×36×3) of stationary electrodes are present. If the degree of non-diagonality $\delta'/\delta$ is large as in the conventional microactuator 1000 (FIG. 10), the calculation amount for correcting displacements associated with non-diagonality becomes huge, and the control structure becomes complicated, thus resulting in a tremendous increase in cost and a decrease in the driving speed of the microactuator. According to the present invention, the calculation amount for correcting displacements associated with non-diagonality can be very small, so that cost reduction and enhancement of the driving speed of the microactuator can be realized. The present invention is especially useful in the case of driving a large number of microactuators.

In the case where correction for displacements associated with non-diagonality is to be performed, an operation of multiplying the target displacement amount for each point in the movable electrode 6 by an inverse matrix of the matrix on the right-hand side of (eq. 13) may be performed to determine driving forces to be generated by the stationary electrodes 4a to 4c, and driving voltages may be determined from the determined driving forces, thus generating the control signal D. Even in this case, since the non-diagonality of each microactuator 10 is already smaller than conventionally, it is easy to obtain a high correction accuracy, and the deterioration in the accuracy of non-linear correction due to fluctuations in the characteristics of the actuators is small, too. Moreover, in the case where each microactuator 10 satisfies:

$2 \leq R^2 \cdot kz/krx$; and $2 \leq R^2 \cdot kz/kry$, even if the aforementioned inverse matrix calculation is performed, each driving force will find its solution in a positive (pulling direction) range of values. Therefore, even in the case where a driving force which can only occur in a pulling direction, e.g., electrostatic force, is employed, the wave front correction control section 46 can easily perform correction for displacements associated with non-diagonality.

Next, with reference to FIG. 8A to FIG. 9B, coordinate positions of points of application in the movable section 7 that will make for an improved wave front approximation accuracy will be described. Each of points of application A to C on the movable section 7 is a point on an axis which extends through the center of a region of the corresponding stationary electrode among the stationary electrodes 4a to 4c where the driving force occurs and which is perpendicular to that stationary electrode. The center of a region in which a driving force for a single stationary electrode occurs coincides with the center of that stationary electrode, for example.

The microactuator 10 is capable of bi-axial tilt and mono-axial vertical displacement. Descriptions will be given in the following order: first, a one-dimensional model where mono-axial tilt and mono-axial vertical displacement take place will be described, followed by a description of a two-dimensional model where bi-axial tilt and mono-axial vertical displacement take place.

Figure 8A:
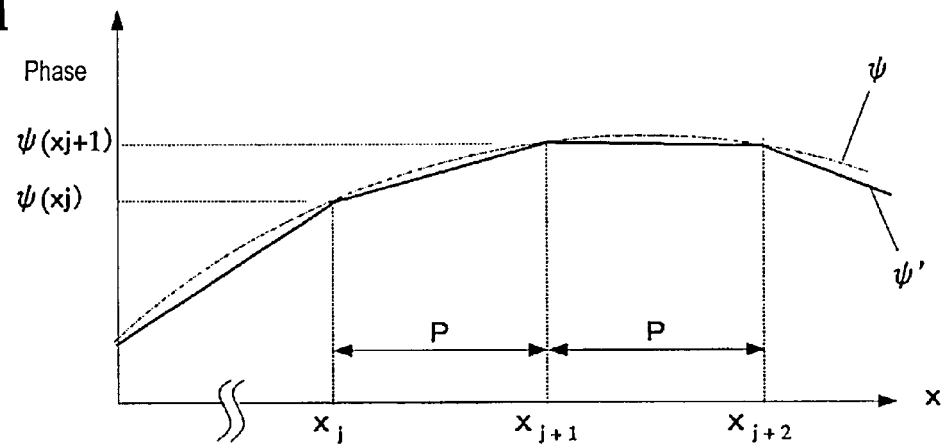
FIG. 8A An explanatory diagram showing a one-dimensional model representing the relationship between coordinate positions of points of application in a movable section according to the Embodiment 4 of the present invention and wave front approximation accuracy.
Figure 8B:
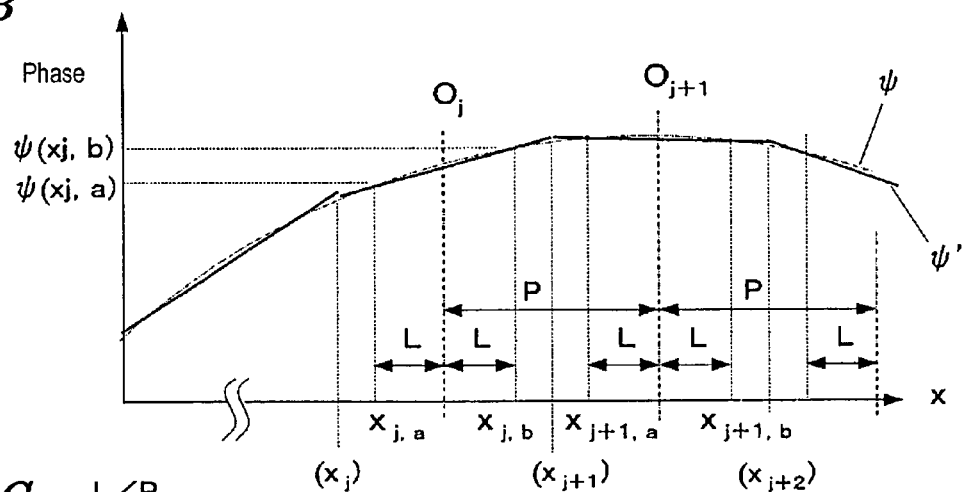
FIG. 8B An explanatory diagram showing a one-dimensional model representing the relationship between coordinate positions of points of application in a movable section according to Embodiment 4 of the present invention and wave front approximation accuracy.

FIG. 8A and FIG. 8B are explanatory diagrams of a one-dimensional model representing the relationship between coordinate positions of points of application in the movable section 7 and wave front approximation accuracy.

First, with reference to FIG. 8A, a commonly-used line approximation method for a wave front will be described.

In FIG. 8A, the horizontal axis represents coordinate positions of the microactuator 10 in the x direction, whereas the vertical axis represents the phase of a wave front. A phase function $\psi$ which serves as the correction target is shown by a chain double-dashed line. As already described, the phase function $\psi$ is given as a function of the coordinate position x. Since the mirror section 6b is controllable in terms of displacement and tilt with respect to the base 1, the phase function $\psi$ is to be reproduced through line approximations. It is assumed that the pitch between adjoining mirror sections 6b is P. By taking a coordinate point $x_j$ (where j is an integer) for each pitch P, and connecting between the values $\psi(x_j)$ and $\psi(x_{j+1})$ of the phase function $\psi$ for two adjoining coordinate points $x_j$ and $x_{j+1}$, the displacements and tilts of the mirror section 6b can be determined. These approximation lines $\psi'$ are shown with solid lines. Although this method only requires a small amount of calculation and allows for a fast calculation process, it will result in a large wave front error.

As another line approximation method, for each section $[x_j, x_{j+1}]$, a displacement and tilt that minimizes the error from the phase function $\psi$ can be determined by a least squares method. With this method, the wave front error can be reduced, but the calculation amount increases.

With reference to FIG. 8B, a line approximation method for a wave front that will make for an improved correction accuracy with a small calculation amount will be described. Herein, two coordinate points $x_{j,a}$ and $x_{j,b}$ are taken within a section $[x_j, x_{j+1}]$. The coordinate points $x_{j,a}$ and $x_{j,b}$ are at symmetric positions with respect to the central portion $O_j$ of the movable section 7, and are both in a position at a distance L from the central portion $O_j$. It will be discussed how a light reflecting surface can be defined as a line segment extending through two points, i.e., coordinates $(x_{j,a}, \psi(x_{j,a}))$ and $(x_{j,b}, \psi(x_{j,b}))$, by setting the value of the distance L to an appropriate value.

Figure 8C:
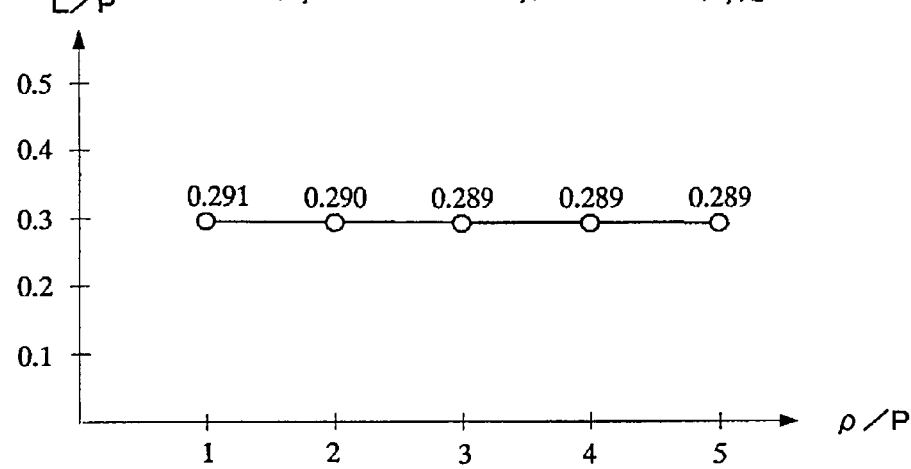
FIG. 8C A diagram showing a plotted relationship between the radius of curvature of a phase function according to Embodiment 4 of the present invention and a distance which minimalizes the wave front error.

FIG. 8C is a diagram showing a plotted relationship between the radius of curvature $\rho$ of the phase function $\psi$ in the section $[x_j, x_{j+1}]$ and the value of the distance L that minimizes the wave front error. It is assumed that the length of the mirror section 6b is substantially equal to the pitch P. A nondimensionalized radius of curvature $\rho/P$ is taken on the horizontal axis, whereas a nondimensionalized distance L/P that will minimize the wave front error is taken on the vertical axis. The wave front error is defined as a square root of $\int (\psi - \psi')^2 dx$, a definite integral value of the error—raised to the second power—in a mirror having a length P. Although the radius of curvature $\rho$ of the phase function $\psi$ may take any arbitrary value, it can be seen from FIG. 8C that the nondimensional distance L/P that minimizes the wave front error hardly depends on the nondimensional radius of curvature $\rho/P$, but takes a constant value of about 0.29. Therefore, by ensuring that the coordinate points $x_{j,a}$ and $x_{j,b}$ (where it is set that the distance L=0.29P) coincide with the coordinate positions of the points of application in the movable section 7, and that the displacement target values at the respective drive points are $\psi(x_{j,a})$ and $\psi(x_{j,b})$, it becomes possible to minimize the wave front error to the same extent as in the method using a least squares method. Moreover, the displacement target values for points of application in the movable section 7 can be further directly calculated from the phase function $\psi$, and thus the calculation amount can be drastically reduced.

With reference to FIG. 9, a case will be described where the aforementioned line approximation method for a wave front that makes for an improved correction accuracy with a small calculation amount is applied to a two-dimensional model. FIG. 9 are explanatory diagrams of a two-dimensional model representing the coordinate positions of points of application in the movable section 7 and the wave front approximation accuracy.

Figure 9A:
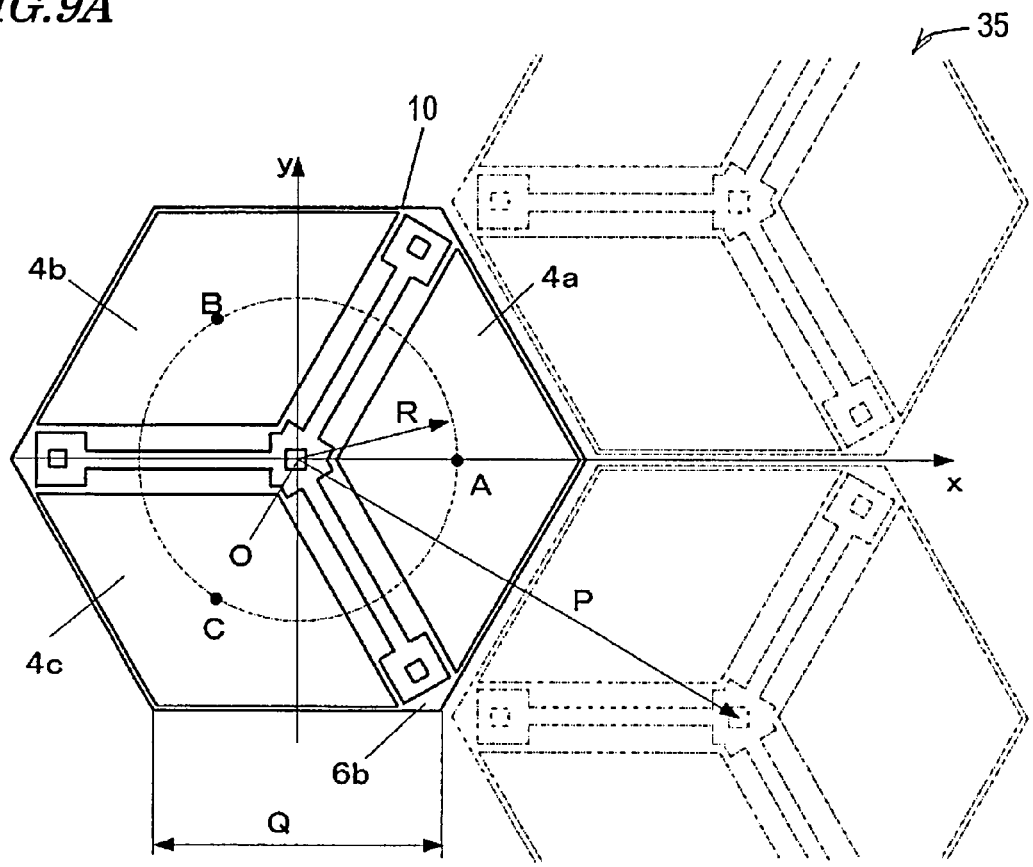
FIG. 9A A plan view schematically showing a microactuator array according to Embodiment 4 of the present invention.

FIG. 9A is a plan view schematically showing the microactuator array 35. The pitch between adjoining mirror sections 6b is P. Herein, it is approximated that the length Q of each side of the mirror section 6b is equal to (P/√3), and the gap between adjoining mirror sections 6b is ignored.

Figure 9B:
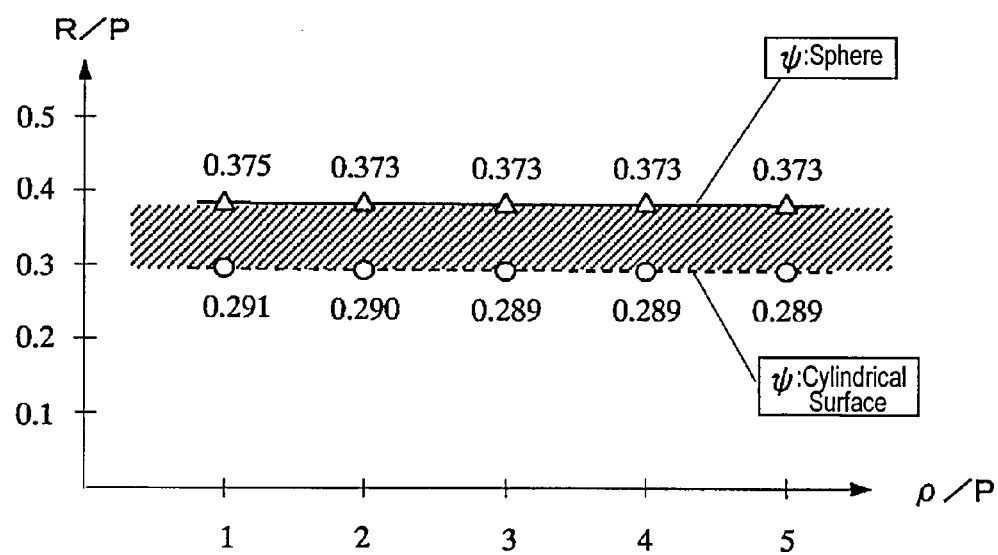
FIG. 9B A diagram showing a plotted relationship between the radius of curvature of a phase function according to Embodiment 4 of the present invention and a distance which minimalizes the wave front error.

FIG. 9B is a diagram showing a plotted relationship between the radius of curvature ρ of the phase function ψ in the mirror section 6b and the value of the distance R that minimizes the wave front error.

In FIG. 9B, a nondimensionalized radius of curvature ρ/P is taken on the horizontal axis, whereas a nondimensionalized nondimensional distance R/P that will minimalize the wave front error is taken on the vertical axis. The wave front error is defined as a square root of $\iint(\psi-\psi')^2 dxdy$, a definite integral value of the error—raised to the second power—in the plane of a regular hexagon mirror plane.

The results in the case where the phase function ψ represents a sphere are shown by solid lines. It can be seen that the nondimensional distance R/P that will minimize the wave front error hardly depends on the nondimensional radius of curvature ρ)/P, but takes a constant value of about 0.37. Moreover, the results in the aforementioned one-dimensional model are also shown with dotted lines. These results substantially correspond to the case where the phase function ψ represents a cylindrical surface which has a curvature only in the x direction but has no curvature in the y direction, but, as has already been described, the nondimensional distance R/P is about 0.29. If the case where the phase function ψ represents a sphere is defined as an oblateness of 0 and the case where the phase function ψ represents a cylindrical surface is defined as an oblateness of 1, a usual wave front has an intermediate oblateness therebetween. Therefore, it will be seen that the range of the nondimensional distance R/P can be set to no less than 0.29 and no more than 0.37, as shown in the hatched portion in the figure.

Thus, by ensuring that the distance R and the pitch P satisfy the relationship of:

$$0.29 \leq R/P \leq 0.37,$$

the approximation accuracy of the wave front error can be enhanced.

Since it is assumed that R=37 μm, P=110 μm in the present embodiment, the value of R/P is 0.336, thus satisfying the relationship of:

$$0.29 \leq R/P \leq 0.37.$$

Since the respective constituent elements are of such relative positioning, the displacement target values of the points of application A to C can be determined through direct calculations, by inputting the coordinate position (x,y) of each point of application to the phase function ψ. The amount of calculation to be performed by the wave front correction control section 46 can be drastically reduced.

INDUSTRIAL APPLICABILITY

A microactuator and an apparatus incorporating microactuators according to the present invention can be suitably used in the fields of optical devices and optical disk apparatuses which perform aberration correction, optical scanning, spectroscopy, and the like. They are also suitably used in fields such as high-frequency circuits (e.g., tunable capacitors), flow control devices (e.g., variable flow paths), and biotechnology.

The invention claimed is:

1. A microactuator comprising:
a base;
a movable section capable of displacement relative to the base;
an elastic supporting member for supporting the movable section so as to allow the movable section to make a displacement relative to the base along a vertical direction and a tilt relative to the base; and
a plurality of driving sections for causing the movable section to be displaced relative to the base,
wherein,
the plurality of driving sections include a first driving section and a second driving section, and
the elastic supporting member supports the movable section at a position intermediate between a first point of application of a first driving force which is exerted by the first driving section on the movable section and a second point of application of a second driving force which is exerted by the second driving section on the movable section, and assuming that:
a spring modulus of a restoring force occurring in the elastic supporting member responsive to a displacement of the movable section relative to the base along the vertical direction is kz(N/m);
a spring modulus of a restoration torque occurring in the elastic supporting member responsive to a tilt angle of the movable section relative to the base is kr(Nm/rad); and
a distance between the first point of application and the second point of application is 2L(m),
kz, kr, and L satisfy the relationship of:

$$0.5 \leq L^2 \cdot kz/kr \leq 2,$$

wherein the elastic supporting member comprises a beam, and
the beam includes a turn-back portion at which a direction in which the beam extends is reversed,
wherein the distance between the turn-back portion and the central portion of the movable section is longer than the distance between a position at which the elastic supporting member is connected to the base and a central portion of the movable section.

2. The microactuator of claim 1, wherein the elastic supporting member supports a generally central portion of the movable section.

3. The microactuator of claim 1, wherein, at least a portion of the movable section is electrically conductive;
each of the plurality of driving sections includes an electrode opposing the movable section; and
each of the plurality of driving sections drives the movable section with an electrostatic force occurring between the movable section and the electrode.

4. The microactuator of claim 1, wherein the plurality of driving sections are disposed so as to be generally symmetric around an axis which extends through the position at which the elastic supporting member supports the movable section and which is perpendicular to the base.

5. The microactuator of claim 1, wherein, when one of the plurality of driving sections drives the movable section so that one end of the movable section is displaced in a direction of approaching the base, another end of the movable section is displaced in a direction of becoming more distant from the base.

6. The microactuator of claim 1, wherein kz, kr, and L satisfy the relationship of:

$$1 \leq L^2 \cdot kz/kr.$$

7. An apparatus comprising a plurality of microactuators of claim 1, wherein
the plurality of microactuators share the base with one another.

8. The apparatus of claim 7, further comprising a control section for outputting a control signal to the plurality of driving sections to control the displacement of the movable section.

9. The apparatus of claim 8, wherein the control section is capable of causing the movable section to be displaced in three or more steps.

10. The apparatus of claim 8, wherein the control section outputs the control signal being in accordance with a target displacement amount for a point of application of a driving force exerted on the movable section by the driving section among the plurality of driving sections that receives the control signal.

11. The apparatus of claim 7, wherein the movable section further comprises a light reflecting surface.

12. The apparatus of claim 11, further comprising a wave front information generation section for receiving light which has passed at the light reflecting surface and generating wave front information representing a wave front state of the light, wherein
the control section causes the movable section to be displaced in accordance with the wave front information.

13. The apparatus of claim 7, further comprising a light source for generating light.

14. A microactuator comprising:
a base;
a movable section capable of displacement relative to the base;
an elastic supporting member for supporting the movable section so as to allow the movable section to make a displacement relative to the base along a vertical direction and a bi-axial tilt relative to the base; and
a plurality of driving sections for causing the movable section to be displaced relative to the base,
wherein,
the elastic supporting member supports the movable section at a position surrounded by a plurality of points of application at which driving forces exerted by the plurality of driving sections on the movable section are applied, and assuming that:
a spring modulus of a restoring force occurring in the elastic supporting member responsive to a displacement of the movable section relative to the base along the vertical direction is kz(N/m);
spring moduli of restoration torques occurring in the elastic supporting member responsive to a tilt angle of the bi-axial tilt of the movable section are krx(Nm/rad) and kry(Nm/rad); and
a distance between each of the plurality of points of application and the position at which the elastic supporting member supports the movable section is R(m),
kz, krx, kry, and R satisfy the relationships of:

$$1 \leq R^2 \cdot kz/krx \leq 5;$$

$$1 \leq R^2 \cdot kz/kry \leq 5; \text{ and}$$

$$0.67 \leq krx/kry \leq 1.5,$$

wherein the elastic supporting member comprises a first end portion connected to the base and a second end portion connected to the movable section, and
assuming that a distance between the first end portion and the second end portion is H,
H and R satisfy the relationship of:

$$0.8 \leq H/R \leq 1.6, \text{ and}$$

wherein a distance between the first end portion and a central portion of the movable section is longer than a distance between the second end portion and the central portion of the movable section.

15. The microactuator of claim 14, wherein the elastic supporting member supports a generally central portion of the movable section.

16. The microactuator of claim 14, wherein, at least a portion of the movable section is electrically conductive;
each of the plurality of driving sections includes an electrode opposing the movable section; and
each of the plurality of driving sections drives the movable section with an electrostatic force occurring between the movable section and the electrode.

17. The microactuator of claim 14, wherein the plurality of driving sections are disposed so as to be generally symmetric around an axis which extends through the position at which the elastic supporting member supports the movable section and which is perpendicular to the base.

18. The microactuator of claim 14, wherein,
the elastic supporting member comprises a beam, and
the beam includes a turn-back portion at which a direction in which the beam extends is reversed.

19. The microactuator of claim 18, wherein the distance between the turn-back portion and the central portion of the movable section is longer than the distance between a position at which the elastic supporting member is connected to the base and a central portion of the movable section.

20. The microactuator of claim 14, wherein, when one of the plurality of driving sections drives the movable section so that one end of the movable section is displaced in a direction of approaching the base, another end of the movable section is displaced in a direction of becoming more distant from the base.

21. The microactuator of claim 14, wherein kz, krx, kry, and R satisfy the relationships of:

$$2 \leq R^2 \cdot kz/krx; \text{ and}$$

$$2 \leq R^2 \cdot kz/kry.$$

22. An apparatus comprising a plurality of microactuators of claim 14, wherein,
the plurality of microactuators share the base with one another, and
assuming that a pitch between adjoining microactuators among the plurality of microactuators is P(m),
P and R satisfy the relationship of:

$$0.29 \leq R/P \leq 0.37.$$

23. An apparatus comprising a plurality of microactuators of claim 14, wherein
the plurality of microactuators share the base with one another.

24. The apparatus of claim 23, further comprising a control section for outputting a control signal to the plurality of driving sections to control the displacement of the movable section.

25. The apparatus of claim 24, wherein the control section is capable of causing the movable section to be displaced in three or more steps.

26. The apparatus of claim 24, wherein the control section outputs the control signal being in accordance with a target displacement amount for a point of application of a driving force exerted on the movable section by the driving section among the plurality of driving sections that receives the control signal.

27. The apparatus of claim 23, wherein the movable section further comprises a light reflecting surface.

28. The apparatus of claim 23, further comprising a light source for generating light.

29. The apparatus of claim 27, further comprising a wave front information generation section for receiving light which has passed at the light reflecting surface and generating wave front information representing a wave front state of the light, wherein the control section causes the movable section to be displaced in accordance with the wave front information.

* * * * *